US011315869B1

(12) United States Patent
Huang et al.

(10) Patent No.: US 11,315,869 B1
(45) Date of Patent: Apr. 26, 2022

(54) SEMICONDUCTOR DEVICE WITH DECOUPLING UNIT AND METHOD FOR FABRICATING THE SAME

(71) Applicant: NANYA TECHNOLOGY CORPORATION, New Taipei (TW)

(72) Inventors: Tse-Yao Huang, Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/108,736

(22) Filed: Dec. 1, 2020

(51) Int. Cl.
*H01L 23/522* (2006.01)
*H01L 23/00* (2006.01)
*H01L 23/13* (2006.01)

(52) U.S. Cl.
CPC .......... *H01L 23/5223* (2013.01); *H01L 23/13* (2013.01); *H01L 24/19* (2013.01); *H01L 24/20* (2013.01); *H01L 2224/211* (2013.01); *H01L 2924/1205* (2013.01)

(58) Field of Classification Search
CPC ..... H01L 23/5223; H01L 23/13; H01L 24/19; H01L 24/20; H01L 2224/211; H01L 2924/1205
See application file for complete search history.

(56) References Cited

U.S. PATENT DOCUMENTS

| 2010/0019301 A1* | 1/2010 | Huang | H01L 27/10835 257/303 |
| 2011/0180862 A1* | 7/2011 | Anderson | H01L 29/66181 257/296 |
| 2015/0214269 A1* | 7/2015 | Endo | H01L 21/76829 257/443 |
| 2017/0133064 A1* | 5/2017 | Nagatsuka | G11C 16/10 |
| 2020/0058707 A1* | 2/2020 | Choi | H01L 27/307 |

* cited by examiner

*Primary Examiner* — Fernando L Toledo
*Assistant Examiner* — Neil R Prasad
(74) *Attorney, Agent, or Firm* — Muncy, Geissler, Olds & Lowe, PC

(57) ABSTRACT

The present application discloses a semiconductor device with a decoupling unit and a method for fabricating the semiconductor device. The semiconductor device includes a substrate including an array area and a peripheral area adjacent to the array area, a first decoupling unit positioned in the peripheral area of the substrate, a storage unit positioned in the array area of the substrate, a redistribution structure positioned above the peripheral area and the array area of the substrate, a middle insulating layer positioned on the redistribution structure positioned above the peripheral area, and a top conductive layer positioned on the middle insulating layer. The redistribution structure positioned above the peripheral area, the middle insulating layer, and the top conductive layer together configure a second decoupling unit.

20 Claims, 38 Drawing Sheets

SEMICONDUCTOR DEVICE WITH DECOUPLING UNIT AND METHOD FOR FABRICATING THE SAME

TECHNICAL FIELD

The present disclosure relates to a semiconductor device and a method for fabricating the semiconductor device, and more particularly, to a semiconductor device with a decoupling unit and a method for fabricating the semiconductor device with the decoupling unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including an array area and a peripheral area surrounding the array area, a first decoupling unit positioned in the peripheral area of the substrate, a storage unit positioned in the array area of the substrate, a redistribution structure positioned above the peripheral area and the array area of the substrate, a middle insulating layer positioned on the redistribution structure positioned above the peripheral area, and a top conductive layer positioned on the middle insulating layer. The redistribution structure positioned above the peripheral area, the middle insulating layer, and the top conductive layer together configure a second decoupling unit.

In some embodiments, the first decoupling unit and the storage unit are trench capacitors.

In some embodiments, the first decoupling unit includes an inner conductive layer positioned in the substrate, a buried plate surrounding a lower portion of the inner conductive layer, a capacitor dielectric layer positioned between the lower portion of the inner conductive layer and the buried plate, a strap conductive layer positioned on the inner conductive layer, a covering insulating layer positioned on the strap conductive layer, and a joint portion positioned adjacent to the strap conductive layer.

In some embodiments, the inner conductive layer includes a bottom portion surrounded by the buried plate and a collar portion positioned on the bottom portion, and the strap conductive layer is positioned on the collar portion.

In some embodiments, the joint portion and the strap conductive layer have a same electrical type.

In some embodiments, the semiconductor device includes a recessed collar dielectric layer surrounding a lower portion of the collar portion of the inner conductive layer.

In some embodiments, the recessed collar dielectric layer is formed of silicon oxide, silicon nitride, silicon oxynitride, or silicon nitride oxide.

In some embodiments, the semiconductor device includes a first switch unit positioned on the peripheral area of the substrate and positioned adjacent to the joint portion of the first decoupling unit. The first switch unit and the first decoupling unit are electrically coupled.

In some embodiments, a thickness of the middle insulating layer is between about 5 nm and about 100 nm.

In some embodiments, the middle insulating layer is formed of silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof.

In some embodiments, the semiconductor device includes a pad layer positioned under the redistribution structure and electrically connected to the redistribution structure.

In some embodiments, the redistribution structure includes a seed layer positioned above the peripheral area and the array area and a plating layer positioned on the seed layer.

In some embodiments, the semiconductor device includes a barrier layer positioned between the pad layer and the redistribution structure. The barrier layer is formed of titanium, titanium nitride, titanium silicon nitride, tantalum, tantalum nitride, tantalum silicon nitride, or a combination thereof.

In some embodiments, a thickness of the barrier layer is between about 10 angstroms and about 15 angstroms.

In some embodiments, the semiconductor device includes an adjustment layer positioned between the barrier layer and the redistribution structure. The adjustment layer is formed of graphene or graphite.

In some embodiments, the redistribution structure includes a peripheral portion positioned above the peripheral area, an array portion positioned above the array area, and a connection portion connecting the peripheral portion and the array portion. The middle insulating layer is positioned on the peripheral portion.

In some embodiments, the semiconductor device includes a thermal release layer positioned on the array portion of the redistribution structure. The thermal release layer is configured to sustain a thermal resistance between about 0.04° C. cm$^2$/Watt and about 0.25° C. cm$^2$/Watt.

In some embodiments, the thermal release layer includes an organic material interstitially mingled with carbon nanotubes.

Another aspect of the present disclosure provides a method for fabricating a semiconductor device including providing a substrate including an array area and a peripheral area surrounding the array area, concurrently forming a first decoupling unit in the peripheral area of the substrate and a storage unit in the array area of the substrate, forming a redistribution structure above the peripheral area of the substrate and the array area of the substrate, forming a middle insulating layer on the redistribution structure formed above the peripheral area of the substrate, and forming a top conductive layer on the middle insulating layer. The redistribution structure formed above the peripheral area, the middle insulating layer, and the top conductive layer together configure a second decoupling unit.

In some embodiments, the first decoupling unit and the storage unit are trench capacitors.

Due to the design of the semiconductor device of the present disclosure, the first decoupling unit and the second decoupling unit may act as temporary charge reservoirs to prevent momentary fluctuations in supply voltage. As a result, the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
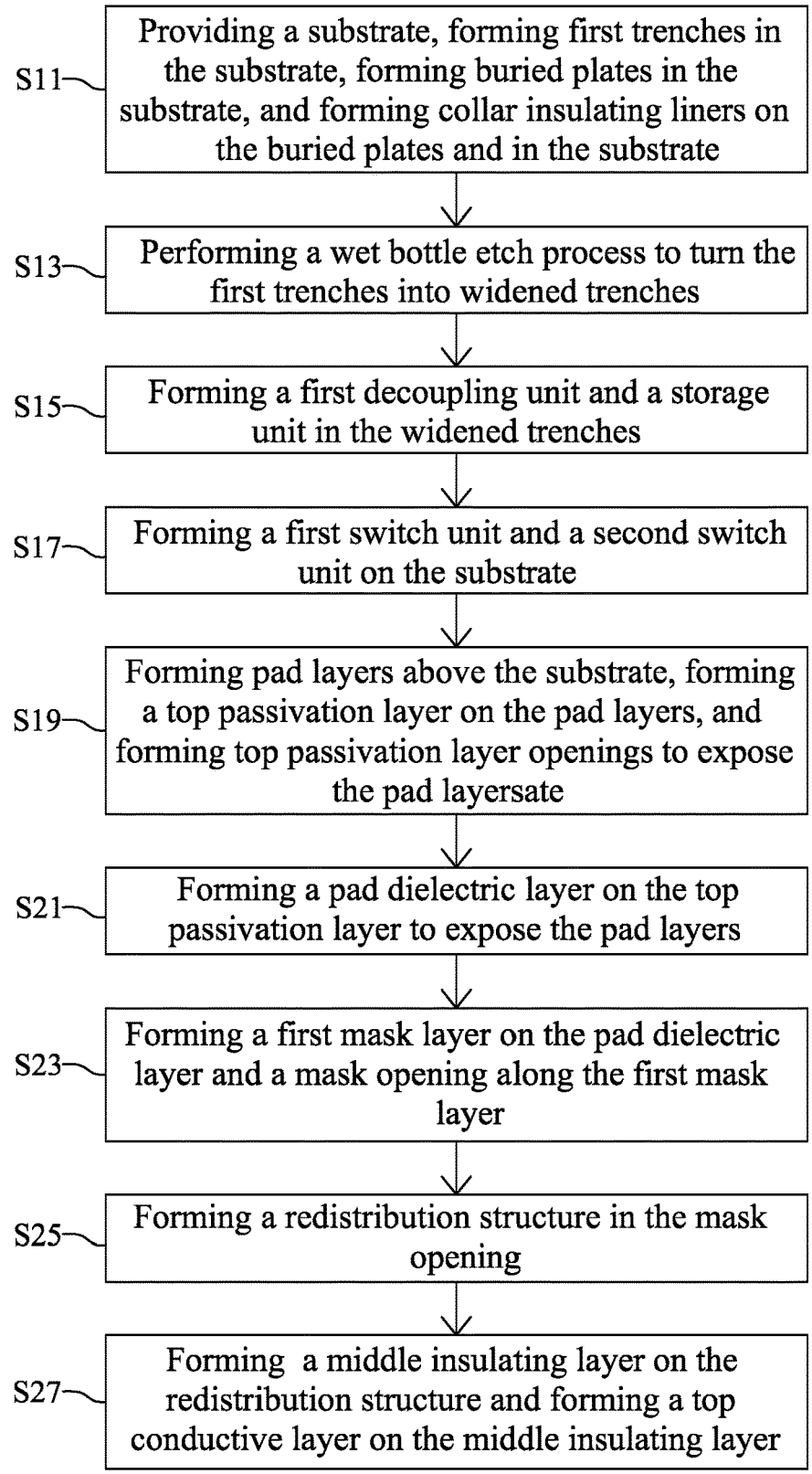
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 22 illustrate, in schematic cross-sectional view diagrams, part of a flow for fabricating the semiconductor device 1A in accordance with one embodiment of the present disclosure.

With reference to FIGS. 1 to 8, at step S11, a substrate 101 may be provided, first trenches 701 may be formed in the substrate 101, buried plates 201-1, 201-3 may be formed in the substrate 101, and collar insulating liners 617 may be formed on the buried plates 201-1, 201-3 and in the substrate 101.

Figure 2:
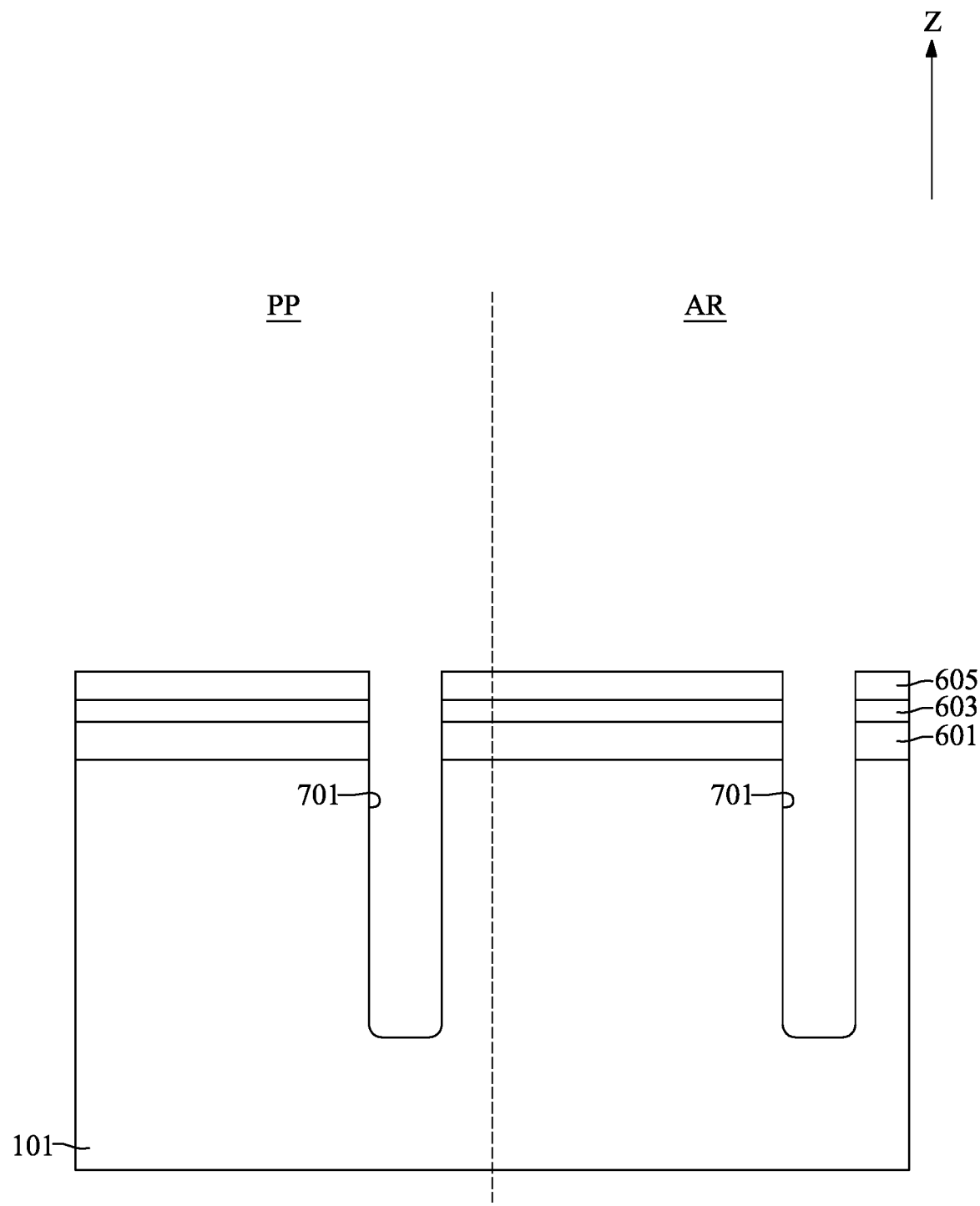
FIGS. 2 to 22 illustrate, in schematic cross-sectional view diagrams, part of a flow for fabricating the semiconductor device in accordance with one embodiment of the present disclosure.

With reference to FIG. 2, the substrate 101 may include an array area AR and a peripheral area PP. The peripheral area PP may surround the array area AR in a top-view perspective (Not shown). The substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm.

It should be noted that the peripheral area PP may comprise a portion of the substrate 101 and a space above the portion of the substrate 101. Describing an element as being disposed on the peripheral area PP means that the element is disposed on a top surface of the portion of the substrate 101. Describing an element as being disposed in the peripheral area PP means that the element is disposed in the portion of the substrate 101; however, a top surface of the element may be even with the top surface of the portion of the substrate 101. Describing an element as being disposed above the peripheral area PP means that the element is disposed above the top surface of the portion of the substrate 101. Accordingly, the array area AR may comprise another portion of the substrate 101 and a space above the other portion of the substrate 101.

With reference to FIG. 2, a first sacrificial oxide layer 601, a sacrificial nitride layer 603, and a second sacrificial oxide layer 605 may be sequentially formed on the substrate 101. The first sacrificial oxide layer 601 may be formed of, for example, silicon oxide. The sacrificial nitride layer 603 may be formed of, for example, silicon nitride. The second sacrificial oxide layer 605 may be formed of, for example, silicon oxide. A photolithography process and a subsequent etch process may be performed to form the first trenches 701 along the second sacrificial oxide layer 605, the sacrificial nitride layer 603, the first sacrificial oxide layer 601, and extending to the substrate 101. It should be noted that only two first trenches 701 are respectively correspondingly shown in the array area AR and the peripheral area PP for clarity. The number of first trenches 701 in the array area AR and the peripheral area PP can be more than one.

Figure 3:
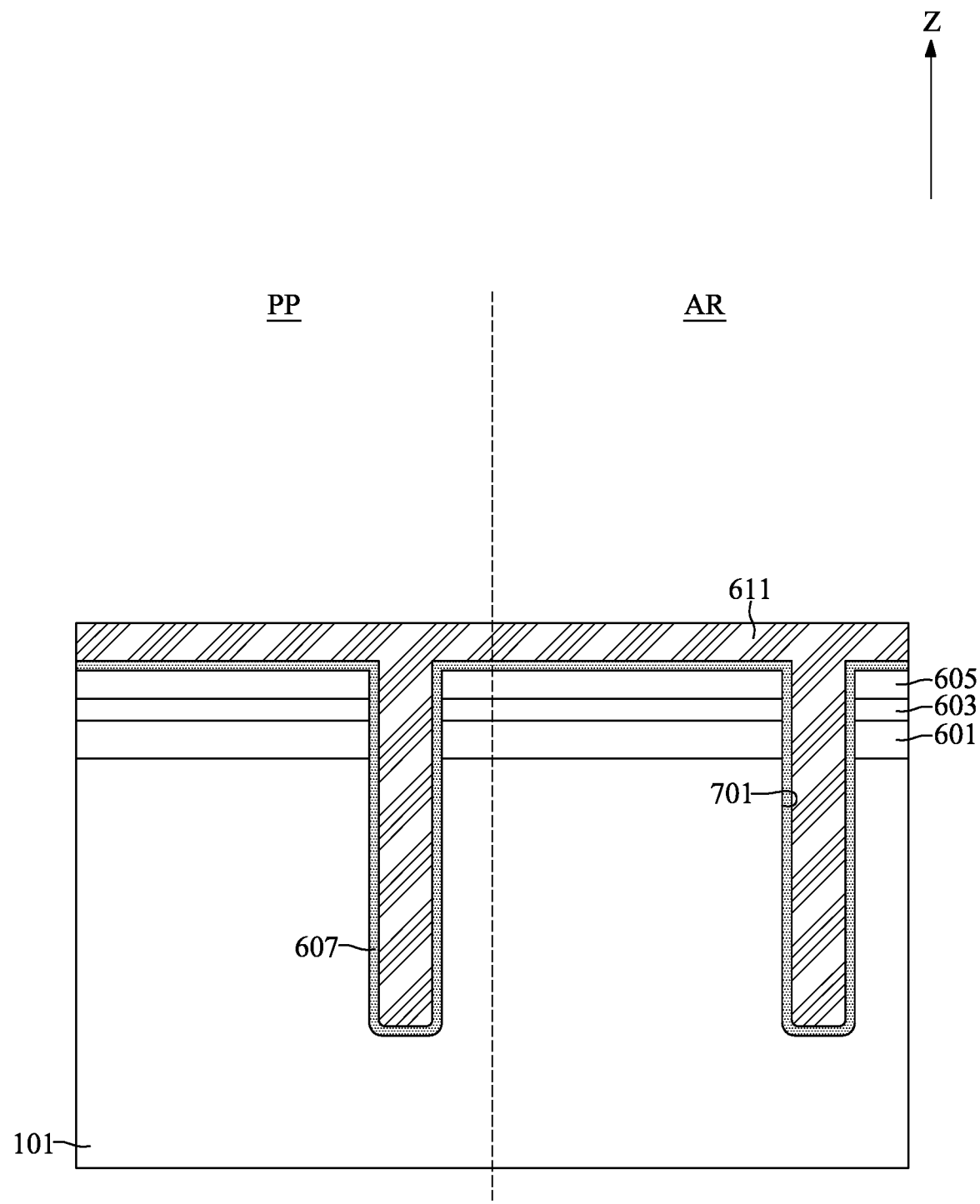

With reference to FIG. 3, a doping source liner 607 may be conformally formed to line with a top surface of the second sacrificial oxide layer 605 and the first trenches 701. The doping source liner 607 may be formed of, for example, arsenic silicate glass and may serve as a dopant source for forming buried plates 201-1, 201-3 as will be illustrated later. A first dummy layer 611 may be formed to fill the first trenches 701 and cover the doping source liner 607. The first dummy layer 611 may be formed of, for example, undoped polysilicon or a material having etching selectivity to the doping source liner 607.

Figure 4:
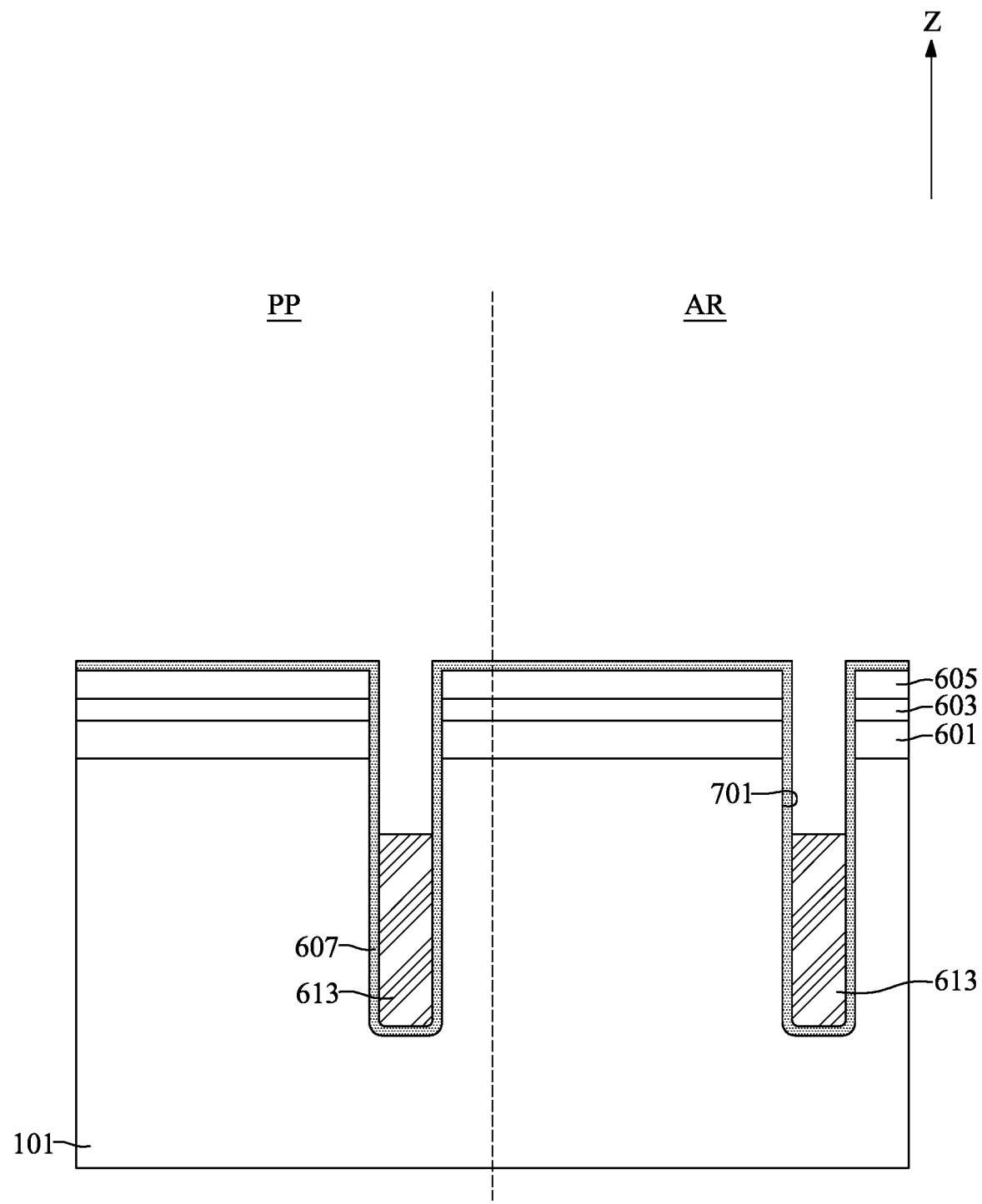

With reference to FIG. 4, an isotropic dry etch process may be performed to recess the first dummy layer 611. After the isotropic dry etch process, the first dummy layer 611 may be turned into recessed dummy layers 613. The etch rate ratio of the first dummy layer 611 to the doping source liner 607 may be between about 100:1 and about 1.05:1, between about 15:1 and about 2:1, or between about 10:1 and about 2:1 during the isotropic dry etch process. The top surfaces of the recessed dummy layers 613 may be at a vertical level lower than the top surface of the substrate 101.

Figure 5:
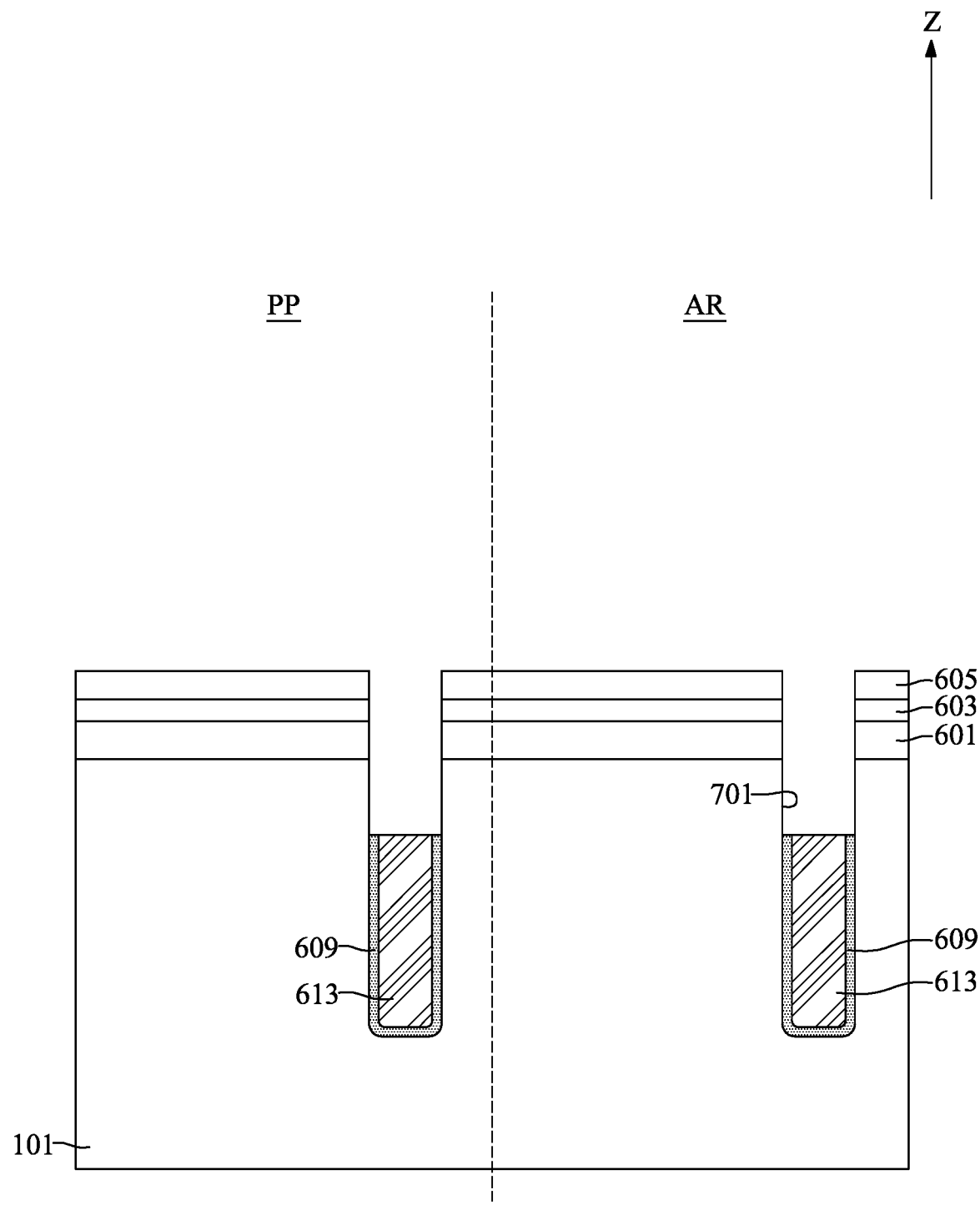

With reference to FIG. 5, an isotropic wet etch process may be performed to recess the doping source liner 607. After the isotropic wet etch process, the doping source liner 607 may be turned into recessed doping source liners 609. The etch rate ratio of the doping source liner 607 to the recessed dummy layers 613 may be between about 100:1 and about 1.05:1, between about 15:1 and about 2:1, or between about 10:1 and about 2:1 during the isotropic wet etch process. The top surfaces of the recessed doping source liners 609 may be substantially coplanar with the top surface of the recessed dummy layers 613.

Figure 6:
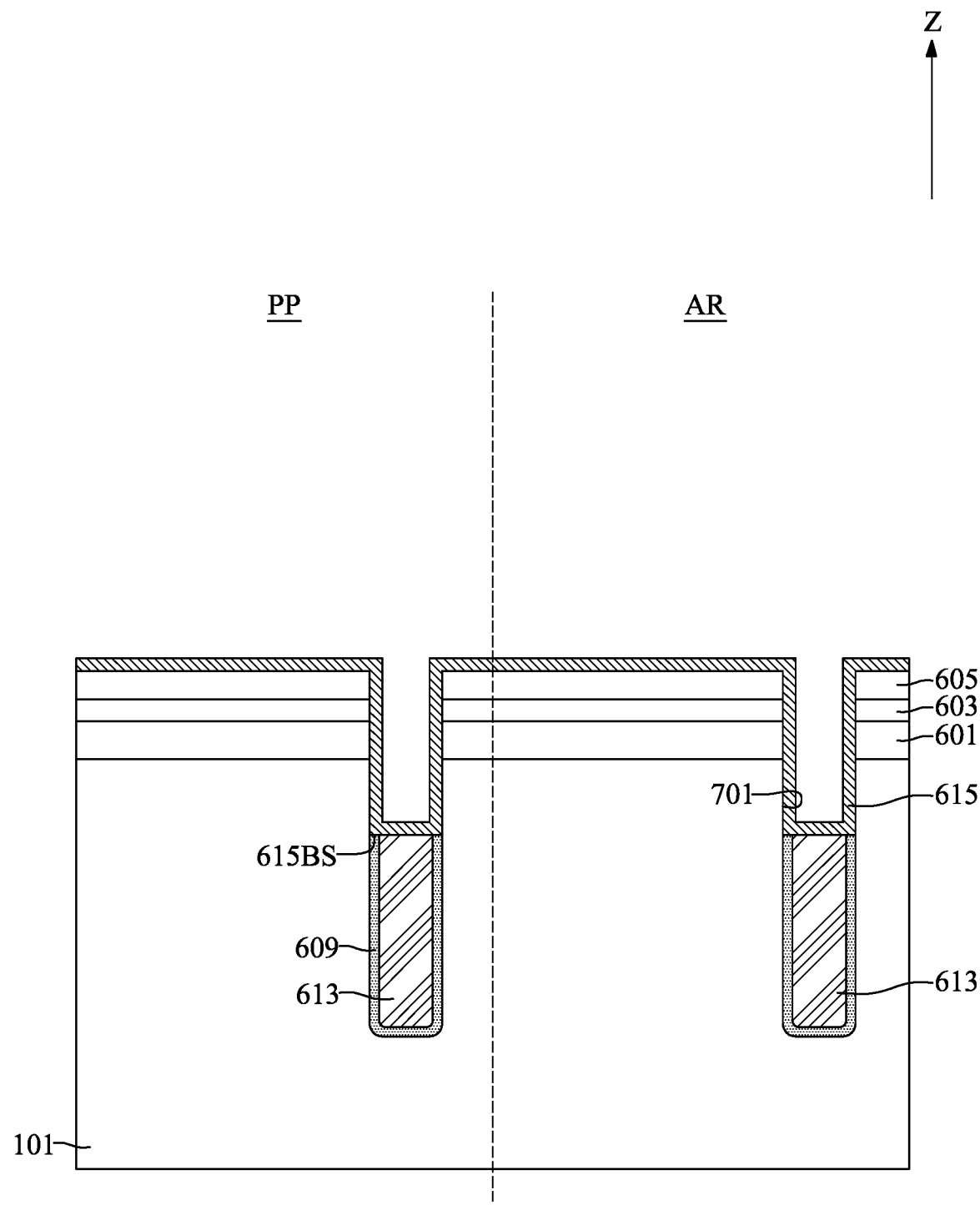

With reference to FIG. 6, a first insulating liner 615 may be conformally formed on the top surface of the second sacrificial oxide layer 605 and in the first trenches 701. The first insulating liner 615 may cover the top surfaces of the recessed dummy layers 613 and the top surfaces of the recessed doping source liners 609. The portions of the first trenches 701 lower than the bottom surface 615BS of the first insulating liner 615 may be referred to as the lower portions of the first trenches 701. The portions of the first trenches 701 higher than the bottom surface 615BS of the first insulating liner 615 may be referred to as the upper portions of the first trenches 701. In some embodiments, the first insulating liner 615 may be formed of, for example, silicon oxide, silicon nitride, silicon oxynitride, silicon nitride oxide, or the like. In some embodiments, the first insulating liner 615 may be formed of, for example, an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof.

Figure 7:
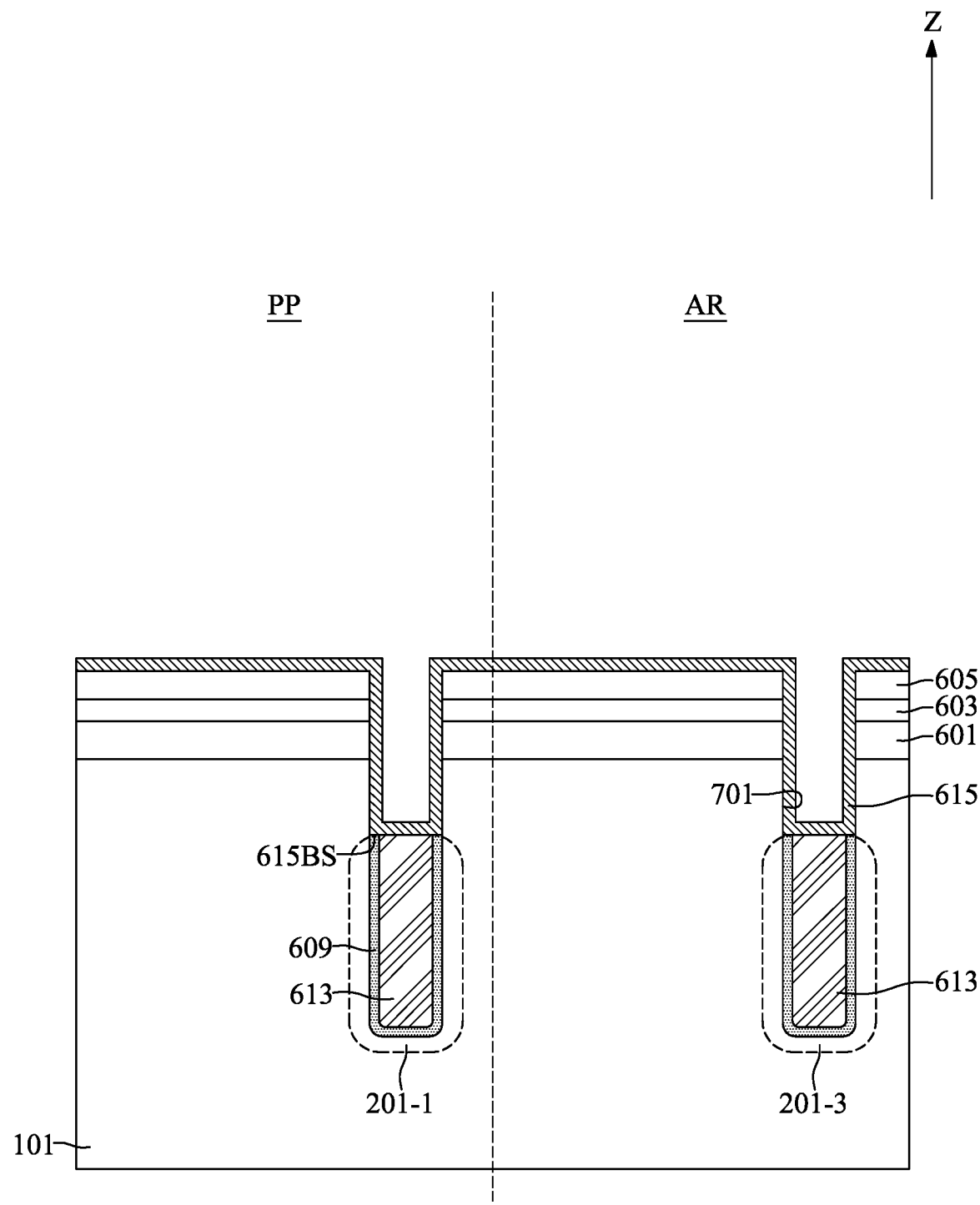

With reference to FIG. 7, an annealing process may be performed to diffuse out the recessed doping source liners 609 and form the buried plates 201-1, 201-3 in regions surrounding the lower portions of the first trenches 701.

Figure 8:
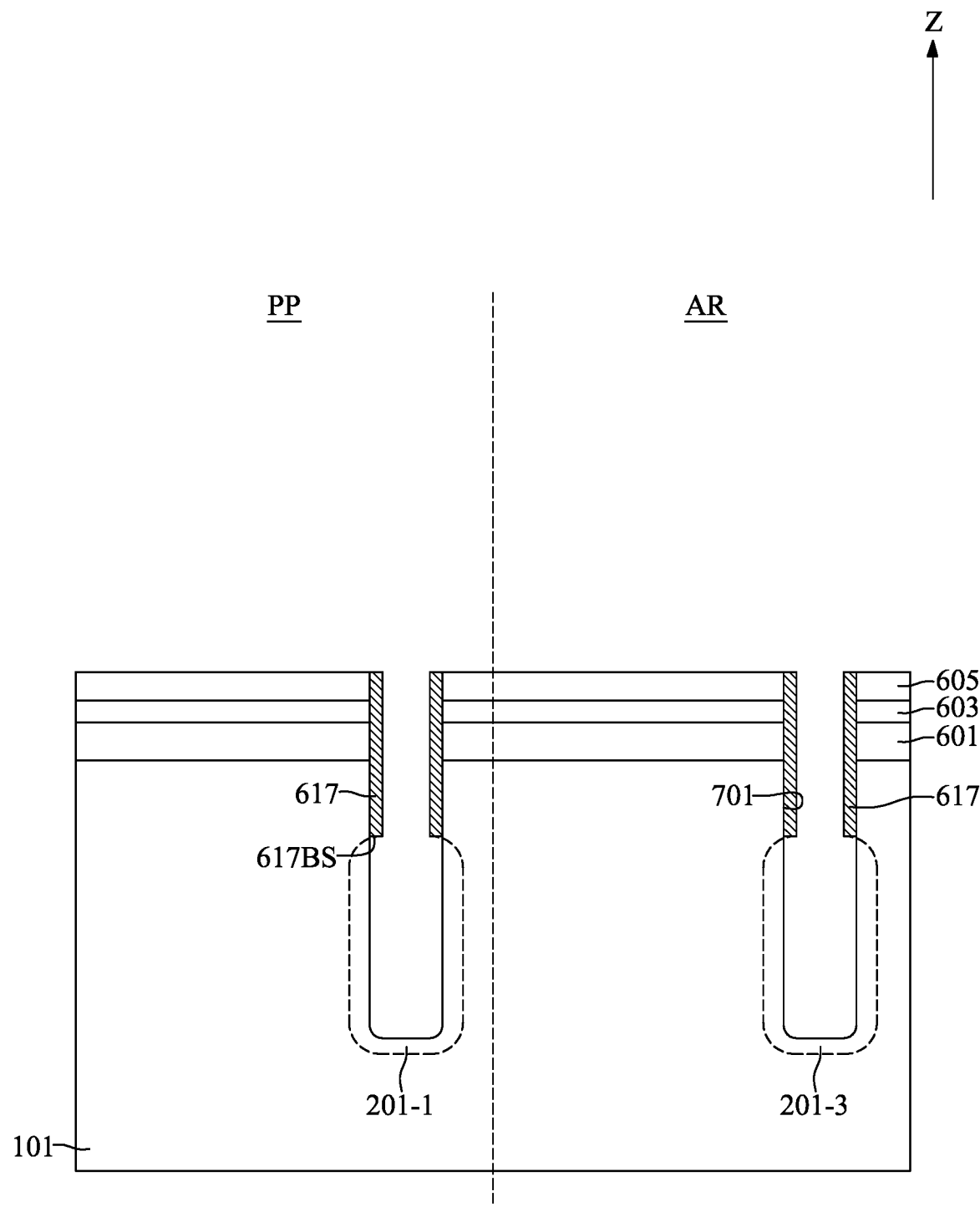

With reference to FIG. 8, an anisotropic dry etch process may be performed to remove the first insulating liner 615 on the top surface of the second sacrificial oxide layer 605 and on the top surface of the recessed dummy layers 613. The etch rate ratio of the first insulating liner 615 to the recessed dummy layers 613 may be between about between about 15:1 and about 2:1 or between about 10:1 and about 2:1 during the anisotropic dry etch process. After the anisotropic dry etch process, the first insulating liner 615 may be turned into collar insulating liners 617. The collar insulating liners 617 may only line with sidewalls of the upper portions of the first trenches 701. The top surfaces of the recessed dummy layers 613 may be exposed.

With reference to FIG. 8, an isotropic dry etch process may be performed to remove the recessed dummy layers 613. The etch rate ratio of the recessed dummy layers 613 to the collar insulating liners 617 may be between about between about 15:1 and about 2:1 or between about 10:1 and about 2:1 during the isotropic dry etch process. Subsequently, a wet etch process may be performed to remove the recessed doping source liners 609. The etch rate ratio of the recessed doping source liners 609 to the collar insulating liners 617 may be between about between about 15:1 and about 2:1 or between about 10:1 and about 2:1 during the wet etch process. The sidewalls of the lower portions of the first trenches 701 may be exposed after the wet etch process. In contrast, the sidewalls of the upper portions of the first trenches 701 may still cover by the collar insulating liners 617.

Figure 9:
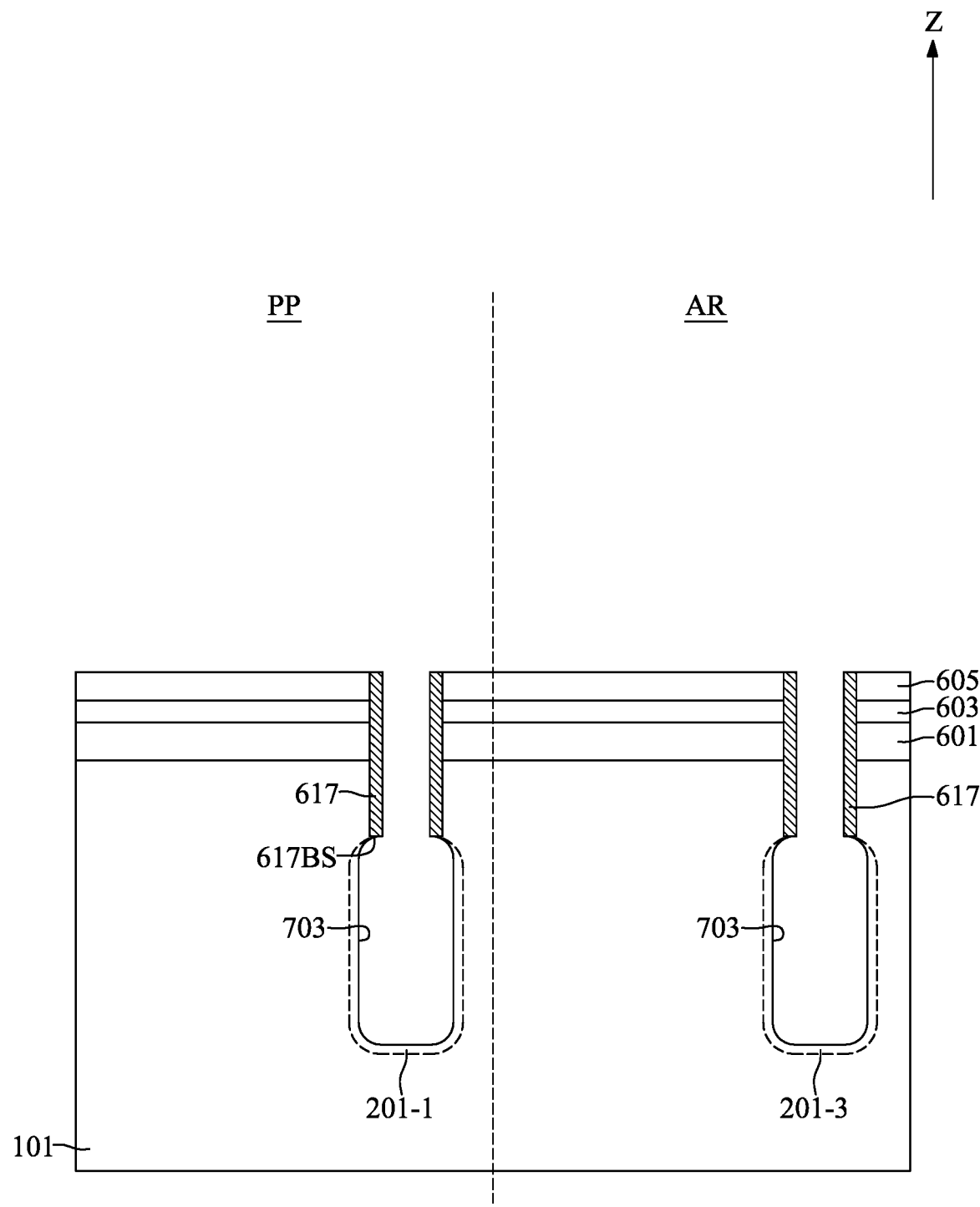

With reference to FIGS. 1 and 9, at step S13, a wet bottle etch process may be performed to turn the first trenches 701 into widened trenches 703.

With reference to FIG. 9, the wet bottle etch process may widen the first trenches 701 to form the widened trenches 703. It should be noted that only the lower portions of the first trenches 701 are widened. The upper portions of the first trenches 701 may be unaffected due to the coverage of the collar insulating liners 617. The etch rate ratio of the substrate 101 to the collar insulating liners 617 may be between about between about 15:1 and about 2:1 or between about 10:1 and about 2:1 during the wet bottle etch process. The portions of the widened trenches 703 higher than the bottom surfaces 617BS of the collar insulating liners 617 may be referred to as the upper portions of the widened trenches 703. The portions of the widened trenches 703 lower than the bottom surfaces 617BS of the collar insulating liners 617 may be referred to as the lower portions of the widened trenches 703.

With reference to FIG. 1 and FIGS. 10 to 20, at step S15, a first decoupling unit 200P and a storage unit 200A may be formed in the widened trenches 703.

Figure 10:
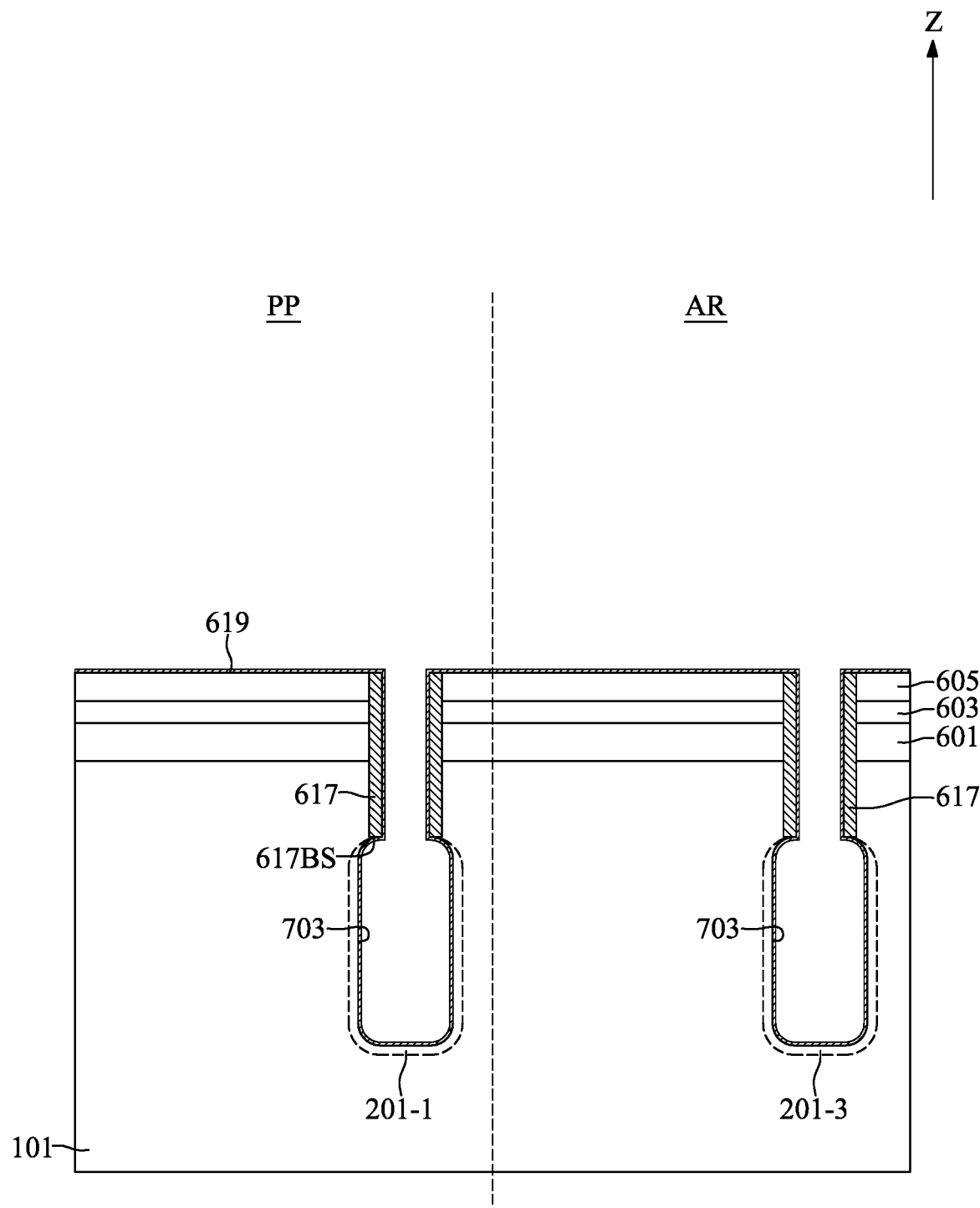

With reference to FIG. 10, a second insulating liner 619 may be conformally formed on the top surface of the second sacrificial oxide layer 605 and in the widened trenches 703 by a deposition process such as chemical vapor deposition or atomic layer deposition. In some embodiments, the second insulating liner 619 may be formed of, for example, silicon oxide, silicon nitride, silicon oxynitride, silicon nitride oxide, fluoride-doped silicate, or the like. In some embodiments, the second insulating liner 619 may be formed of, for example, an insulating material having a dielectric constant of about 4.0 or greater.

Figure 11:
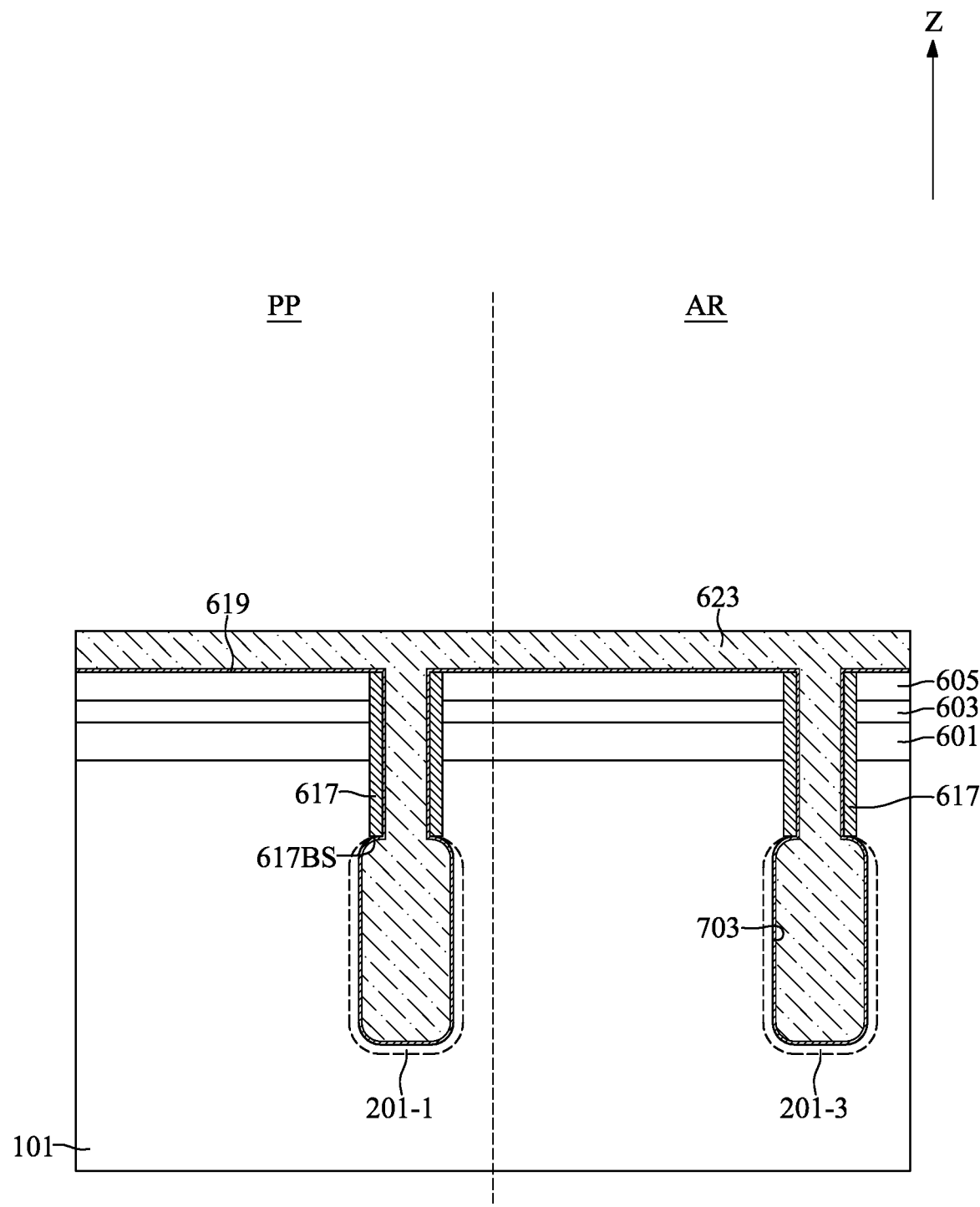

With reference to FIG. 11, a layer of first conductive material 623 may be formed to fill the widened trenches 703 and cover the second insulating liner 619. In some embodiments, the first conductive material 623 may be, for example, polycrystalline silicon, doped polycrystalline silicon, polycrystalline silicon germanium, doped polycrystalline silicon germanium, the like, or a combination thereof. In some embodiments, the first conductive material 623 may be a material having etching selectivity to the collar insulating liners 617 and the second insulating liner 619.

In some embodiments, the first conductive material 623 may be a material form the class containing metal borides, metal phosphides, and metal antimonides of the transition metals from the secondary groups IV, V and VI of the periodic table. The transition metals may be titanium, zirconium, hafnium, vanadium, niobium, tantalum, chromium, molybdenum, or tungsten. Specifically, the material may be titanium diboride, zirconium diboride, hafnium diboride, titanium phosphide, zirconium phosphide, hafnium phosphide, titanium antimonide, zirconium antimonide, or hafnium antimonide. The aforementioned material may have a high thermal stability and excellent conductivity which specific resistance may be less than 20 µΩcm.

In some embodiments, a conductive layer (not shown in FIG. 11) including titanium phosphide and titanium nitride may be disposed between the second insulating liner 619 and the layer of first conductive material 623 to improve the thermal stability and the conductivity of the layer of first conductive material 623.

Figure 12:
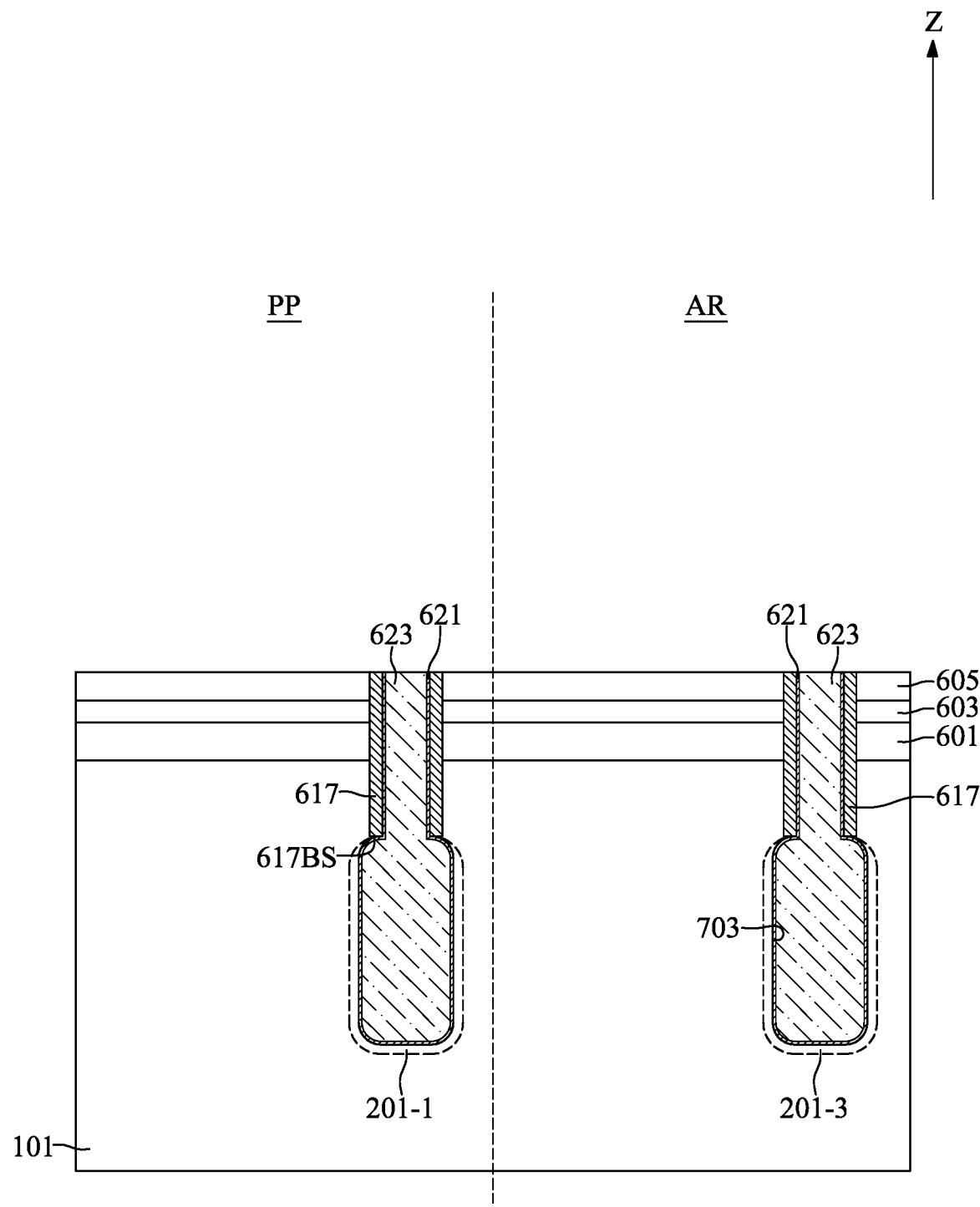

With reference to FIG. 12, a planarization process, such as chemical mechanical polishing, may be performed until the top surface of the second sacrificial oxide layer 605 is exposed to remove excess material, provide a substantially flat surface for subsequent processing steps, and concurrently turn the second insulating liner 619 into recessed second insulating liners 621. The top surfaces of the recessed second insulating liners 621, the top surfaces of the collar insulating liners 617, and the top surface of the second sacrificial oxide layer 605 may be substantially coplanar.

Figure 13:
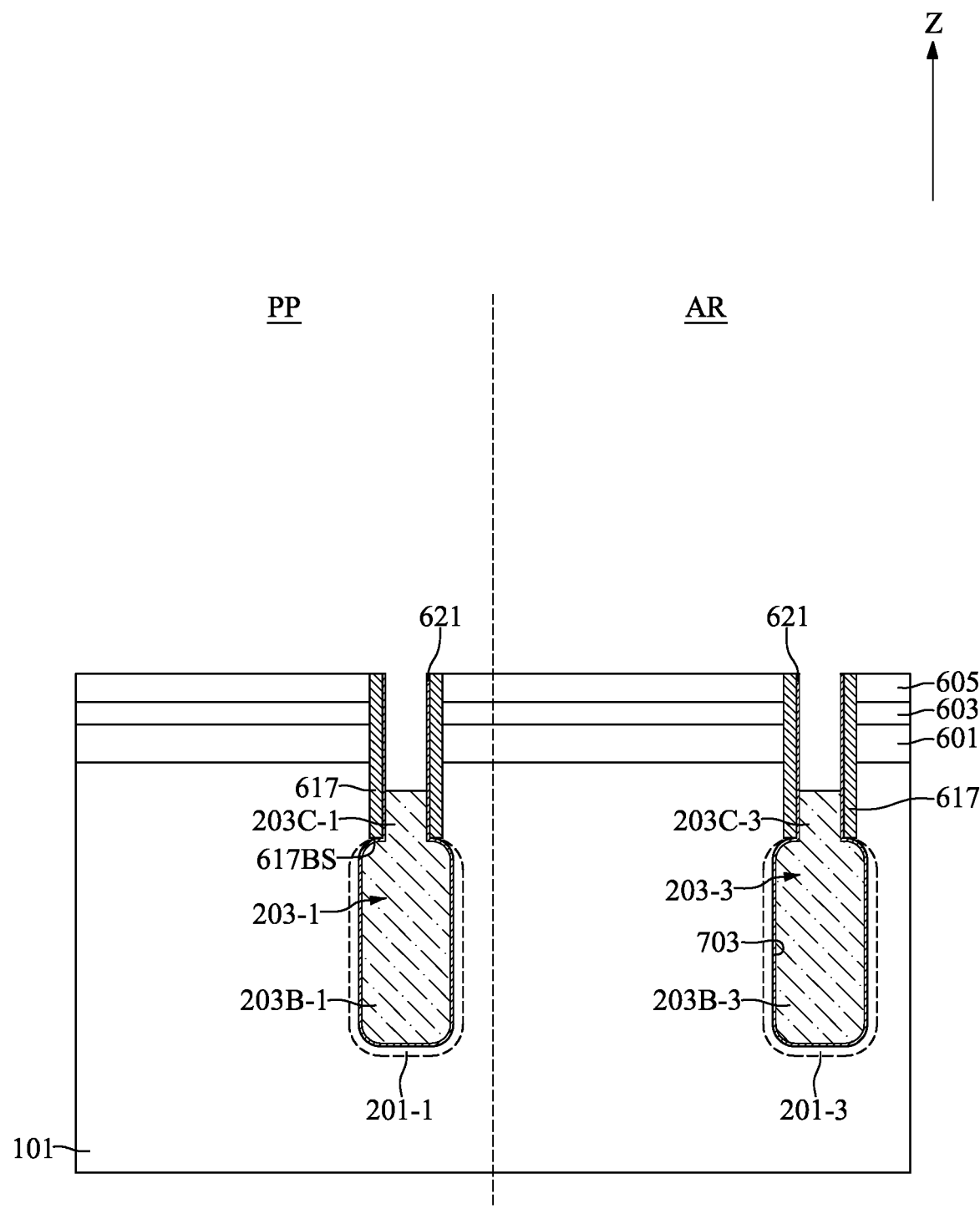

With reference to FIG. 13, an etch back process may be performed to recess the layer of first conductive material 623. The etch rate ratio of the first conductive material 623 to the recessed second insulating liners 621 may be between about between about 15:1 and about 2:1 or between about 10:1 and about 2:1 during the etch back process. The etch rate ratio of the first conductive material 623 to the collar insulating liners 617 may be between about between about 15:1 and about 2:1 or between about 10:1 and about 2:1 during the etch back process.

After the etch back process, the layer of first conductive material 623 may be turned into the inner conductive layers 203-1, 203-3. The inner conductive layer 203-1 may be formed in the widened trench 703 in the peripheral area PP. The inner conductive layer 203-1 may include a bottom portion 203B-1 and a collar portion 203C-1. The inner conductive layer 203-3 may be formed in the widened trench 703 in the array area AR. The inner conductive layer 203-3 may include a bottom portion 203B-3 and a collar portion 203C-3. The bottom portion 203B-1 may be formed in the lower portion of the widened trench 703 in the peripheral area PP. The collar portion 203C-1 may be formed on the bottom portion 203B-1. The bottom portion 203B-3 may be formed in the lower portion of the widened trenches 703 in the array area AR. The collar portion 203C-3 may be formed on the bottom portion 203B-3. The top surfaces of the collar portion 203C-1, 203C-3 may be at a vertical level between the top surface of the substrate 101 and the bottom surfaces 617BS of the collar insulating liners 617. The width of the bottom portion 203B-1, 203B-3 may be greater than the width of the collar portion 203C-1, 203C-3.

Figure 14:
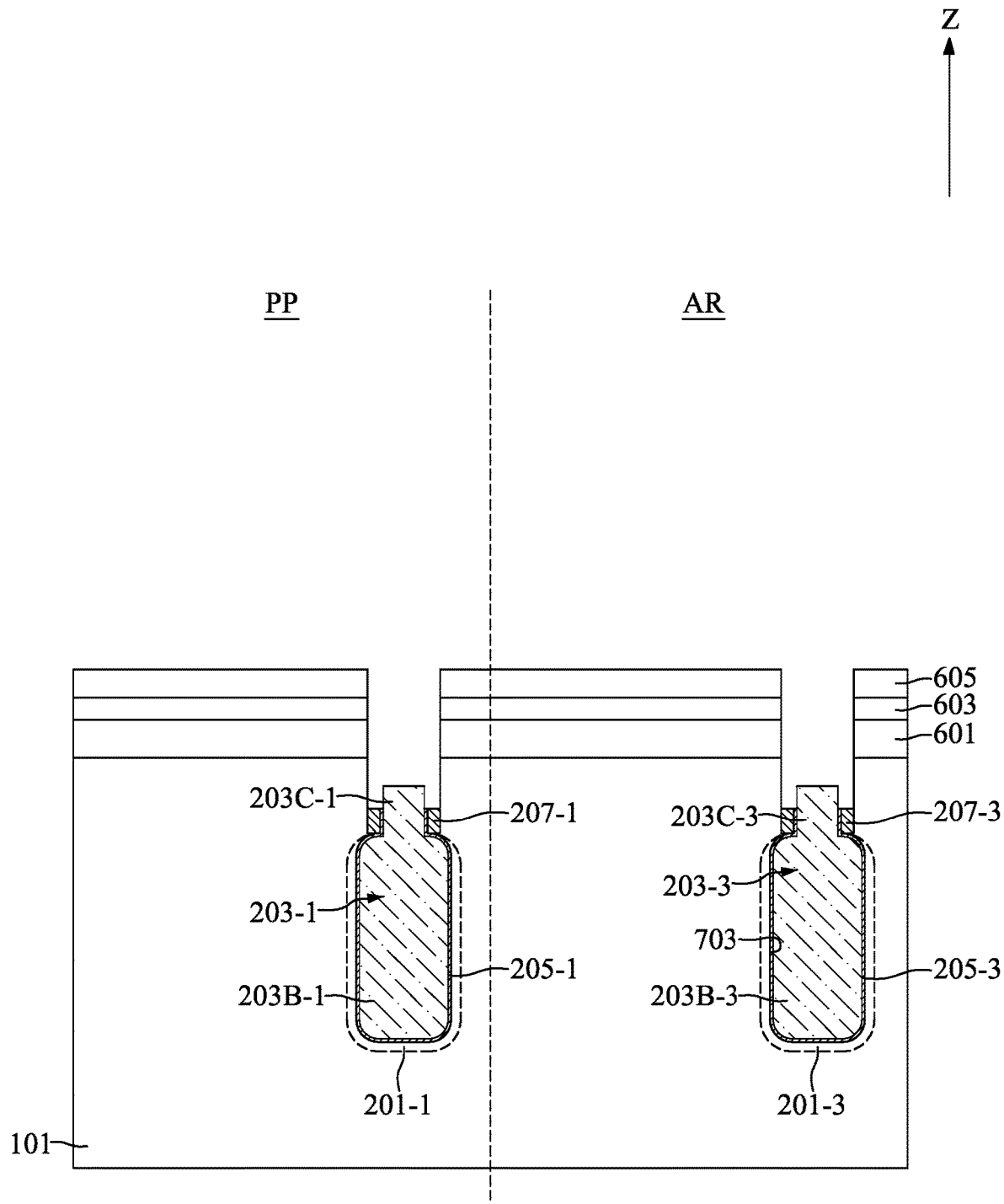

With reference to FIG. 14, a wet etch process may be performed to remove portions of the collar insulating liners 617 and portions of the recessed second insulating liners 621. After the wet etch process, the collar insulating liners 617 may be turned into recessed collar dielectric layers 207-1, 207-3. The recessed second insulating liners 621 may be turned into capacitor dielectric layers 205-1, 205-3. The etch rate ratio of the collar insulating liners 617 to the collar portion 203C-1, 203C-3 may be between about between about 15:1 and about 2:1 or between about 10:1 and about 2:1 during the wet etch process. The etch rate ratio of the recessed second insulating liners 621 to the collar portion 203C-1, 203C-3 may be between about between about 15:1 and about 2:1 or between about 10:1 and about 2:1 during the wet etch process.

With reference to FIG. 14, the top surfaces of the capacitor dielectric layers 205-1, 205-3 and the top surfaces of the recessed collar dielectric layers 207-1, 207-3 may be substantially coplanar. The top surfaces of the collar portion 203C-1, 203C-3 may be at a vertical level higher than a vertical level of the top surfaces of the capacitor dielectric layers 205-1, 205-3 and the top surfaces of the recessed collar dielectric layers 207-1, 207-3. The capacitor dielectric layers 205-1, 205-3 may prevent leakage current from appearing between buried plates 201-1, 201-3 and joint portions 213-1, 213-3 as will be illustrated later.

Figure 15:
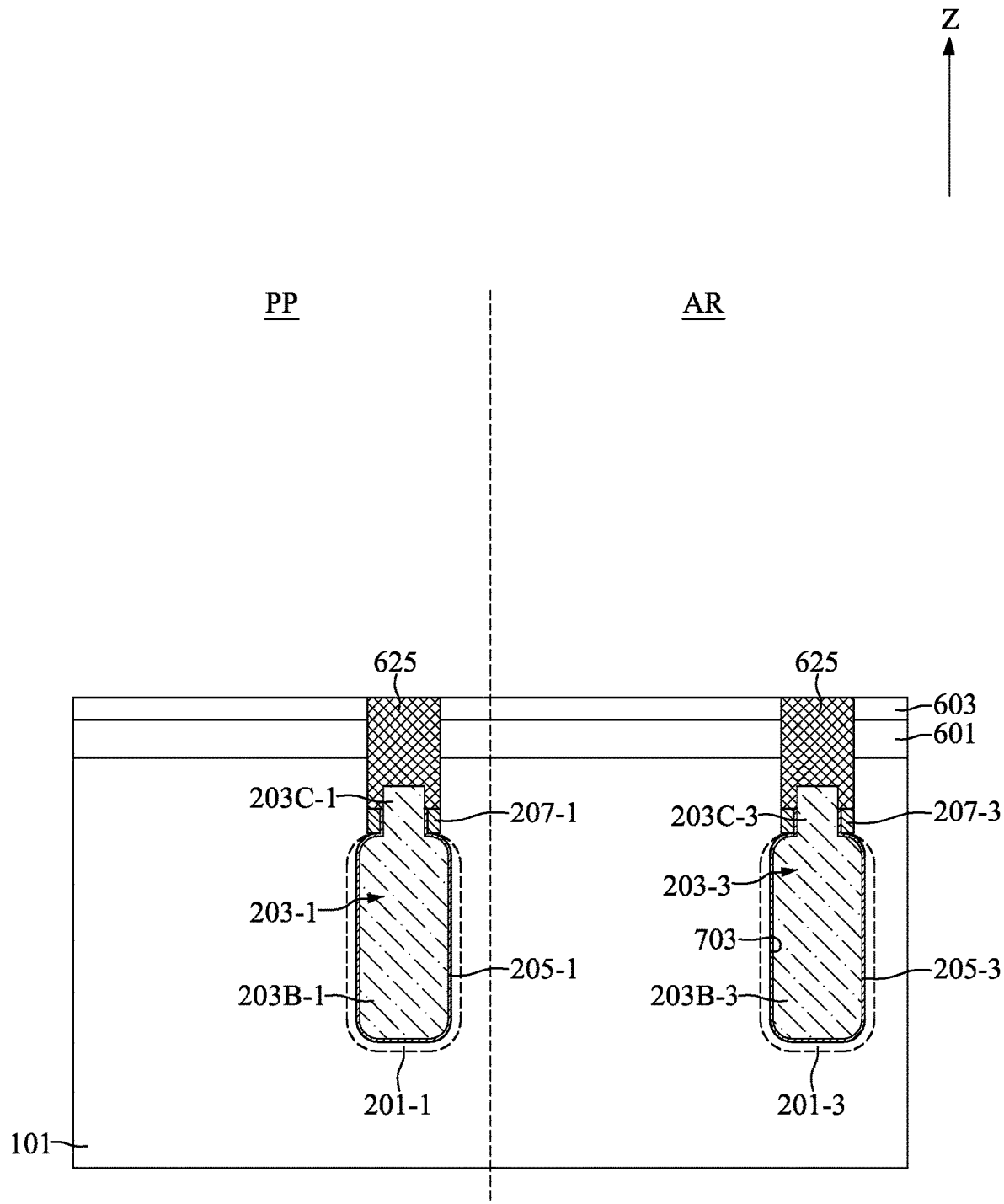

With reference to FIG. 15, a layer of second conductive material 625 may be formed to fill the upper portions of the widened trenches 703 and cover the top surface of the second sacrificial oxide layer 605. Subsequently, a planarization process, such as chemical mechanical polishing, may be performed until the top surface of the sacrificial nitride layer 603 is exposed to remove excess material, provide a substantially flat surface for subsequent processing steps. The second conductive material 625 may be doped polysilicon, doped polycrystalline silicon germanium, or the like.

Figure 16:
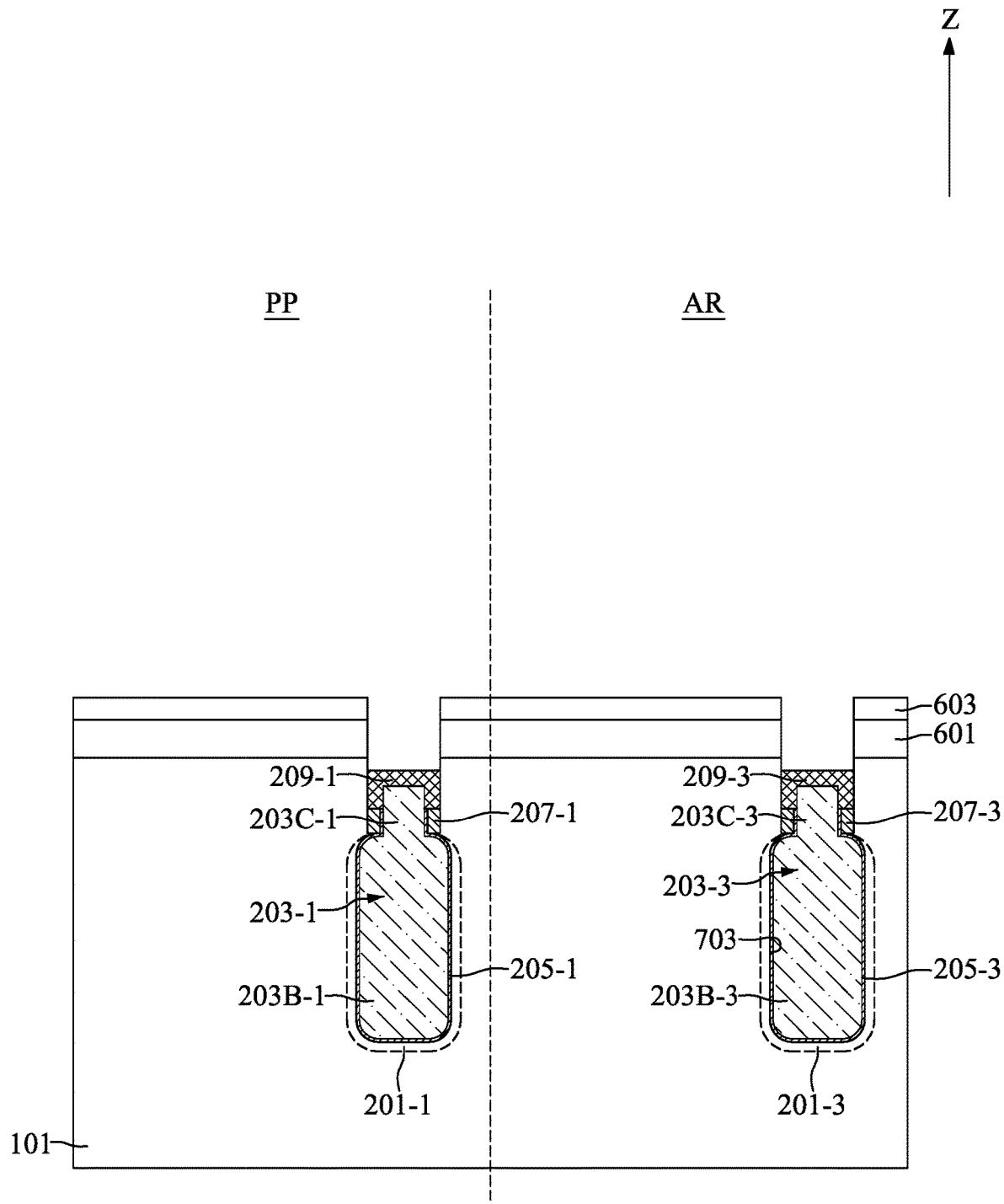

With reference to FIG. 16, an anisotropic etch process may be performed to recess the layer of second conductive material 625. After the anisotropic etch process, the layer of second conductive material 625 may be turned into strap conductive layers 209-1, 209-3. The top surfaces of the strap conductive layers 209-1, 209-3 may be at a vertical level lower than the top surface of the substrate 101.

Figure 17:
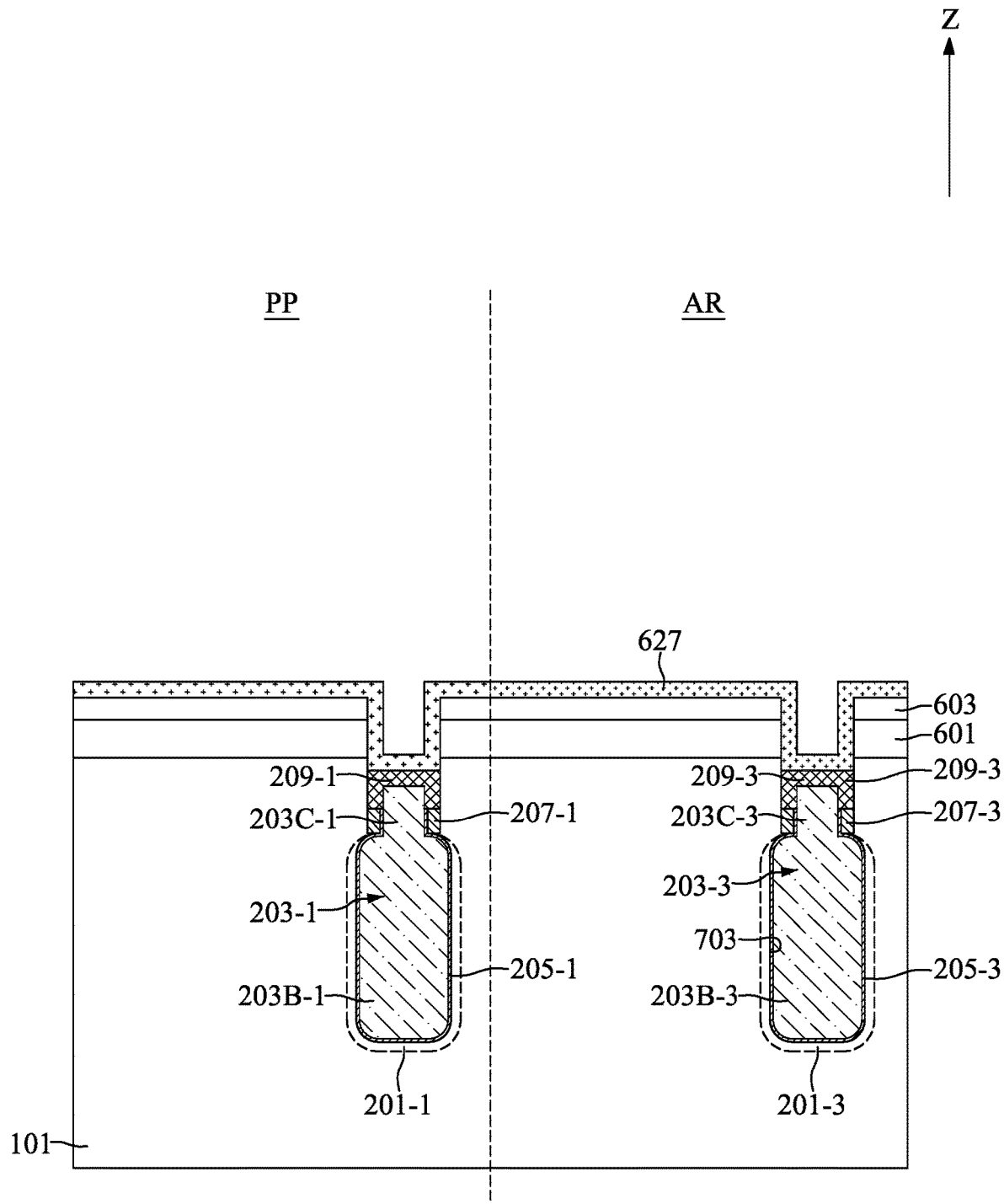

With reference to FIG. 17, a covering insulating liner 627 may be conformally formed on the top surface of the sacrificial nitride layer 603 and in the upper portions of the widened trenches 703. The thickness of the covering insulating liner 627 may be greater than a vertical gap between the top surface of the substrate 101 and the top surfaces of the strap conductive layers 209-1, 209-3. In some embodiments, the covering insulating liner 627 may be formed of, for example, silicon oxide, silicon nitride, silicon oxynitride, silicon nitride oxide, a high-k dielectric material, or a combination thereof. The high-k dielectric material may be hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

Figure 18:
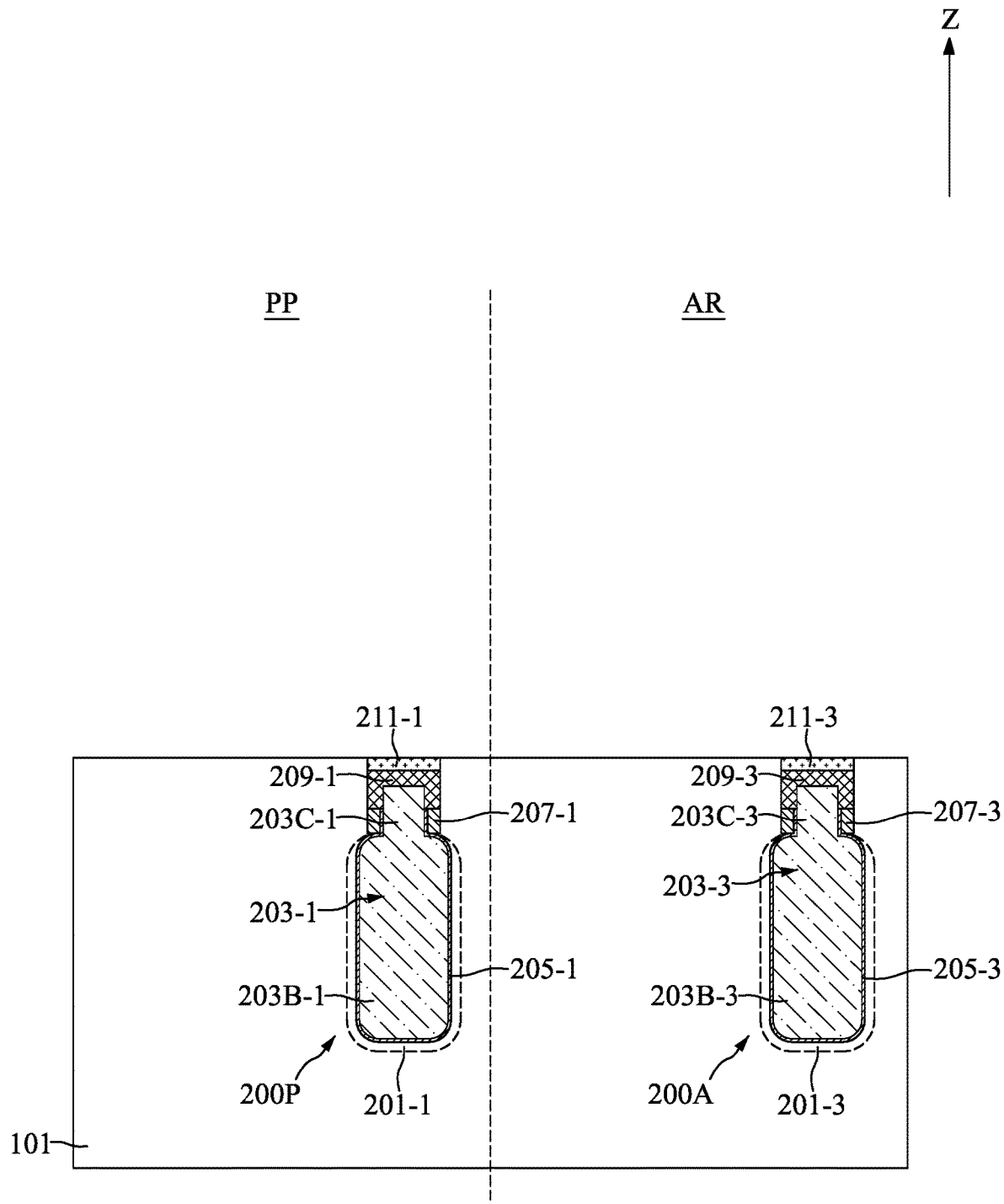

With reference to FIG. 18, a planarization process, such as chemical mechanical polishing, may be performed until the top surface of the substrate 101 is exposed to remove excess material, provide a substantially flat surface for subsequent processing steps, and concurrently turn the covering insulating liner 627 into covering insulating layers 211-1, 211-3. The top surfaces of the covering insulating layers 211-1, 211-3 may be substantially coplanar with the top surface of the substrate 101.

Figure 19:
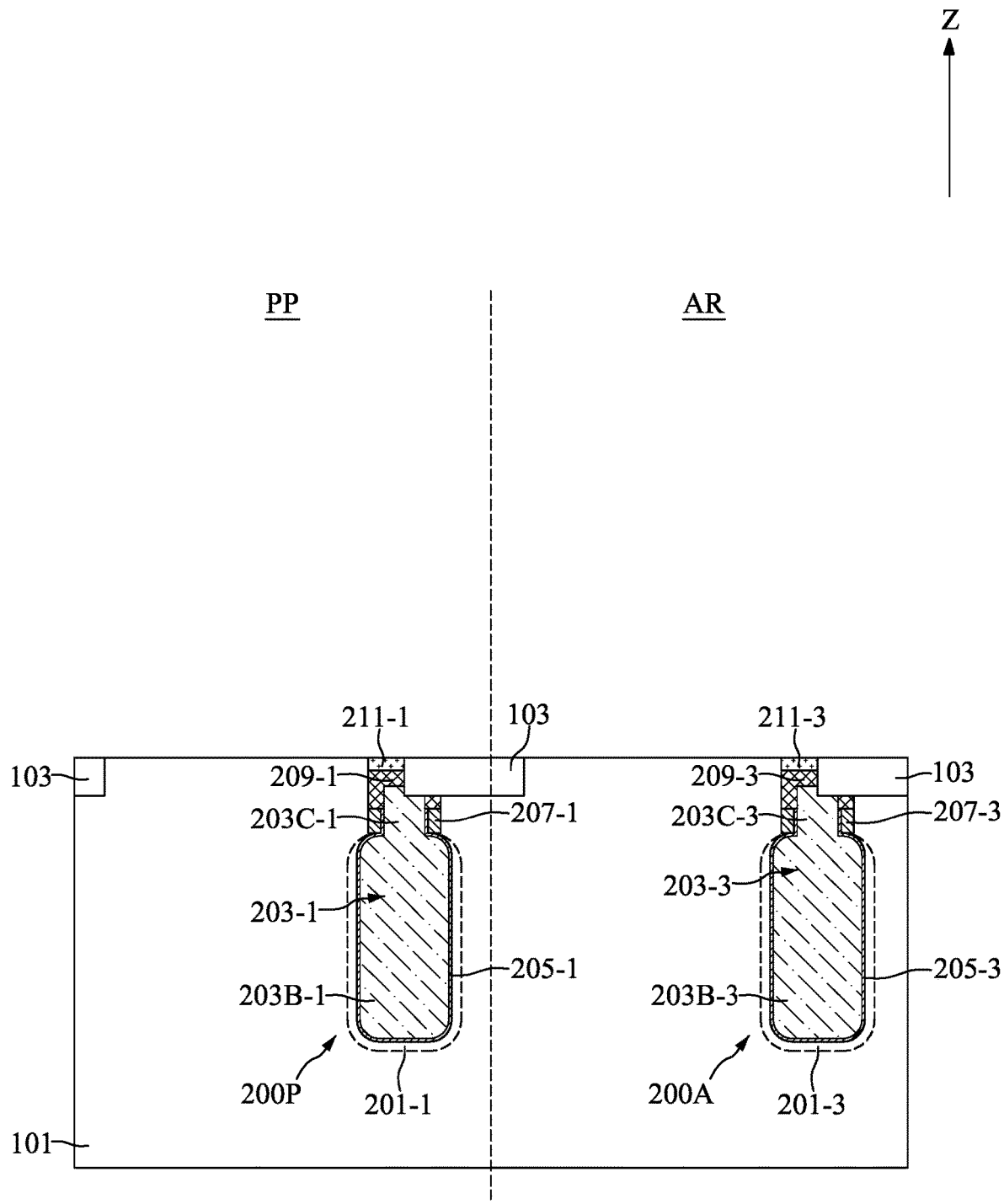

With reference to FIG. 19, the isolation layer 103 may be formed in the substrate 101. The substrate 101 may be formed by removing portions of the covering insulating layers 211-1, 211-3, portions of the strap conductive layers 209-1, 209-3, and portions of the collar portion 203C-1, 203C-3. The isolation layer 103 may prevent the strap conductive layers 209-1, 209-3 or the collar portion 203C-1, 203C-3 diffuse toward to adjacent regions, which may affect the reliability of the semiconductor device 1A, during the following semiconductor processes.

Figure 20:
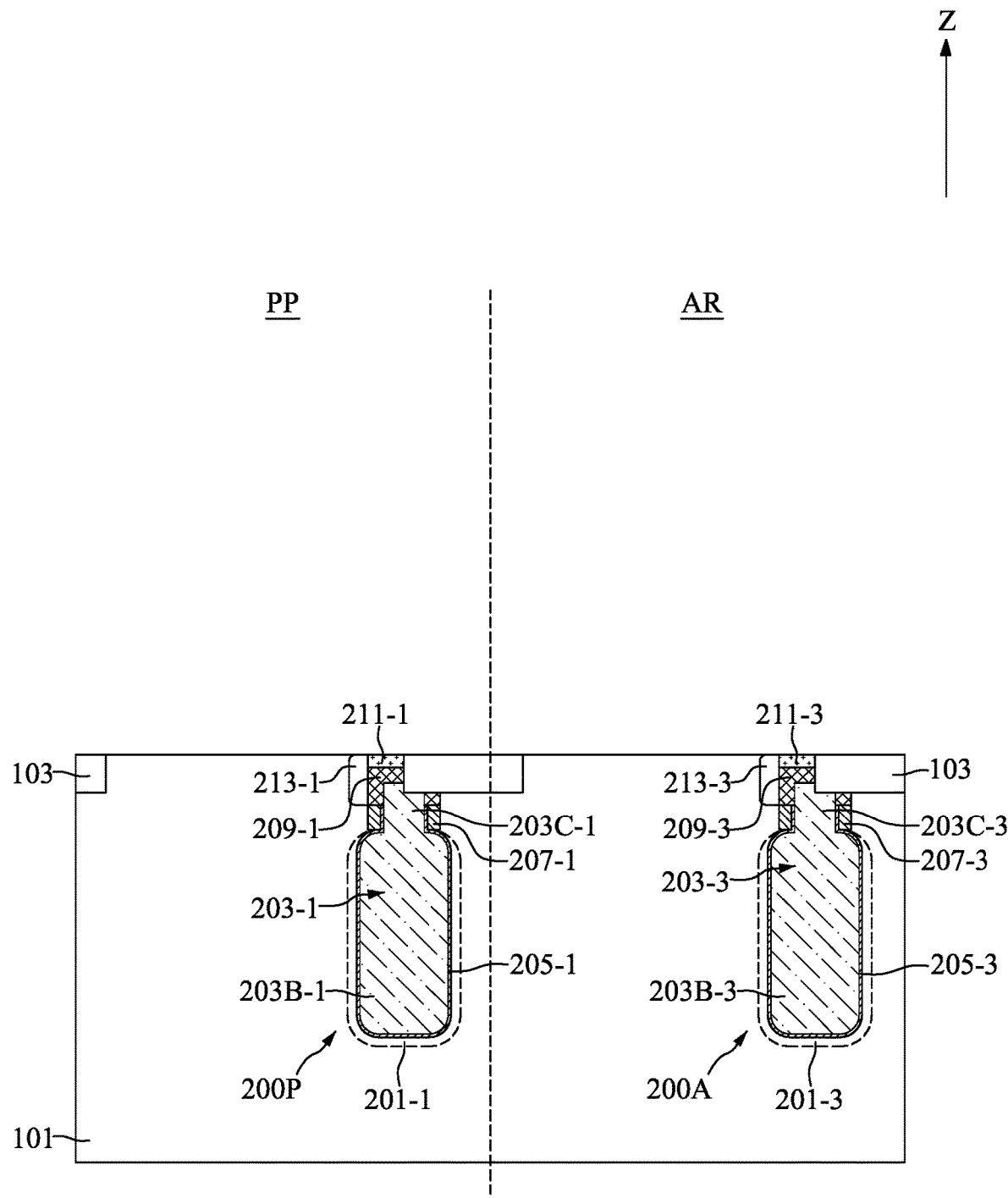

With reference to FIG. 20, dopants in the strap conductive layers 209-1, 209-3 may be diffused out to form joint portions 213-1, 213-3 through an annealing process. In some embodiments, the joint portions 213-1, 213-3, the strap conductive layers 209-1, 209-3, the collar portion 203C-1, 203C-3, and the bottom portion 203B-1, 203B-3 may have a same electrical type.

The buried plate 201-1, the inner conductive layer 203-1, the capacitor dielectric layer 205-1, the recessed collar dielectric layer 207-1, the strap conductive layer 209-1, the covering insulating layer 211-1, and the joint portion 213-1 together configure a first decoupling unit 200P in the peripheral area PP. The buried plate 201-3, the inner conductive layer 203-3, the capacitor dielectric layer 205-3, the recessed collar dielectric layer 207-3, the strap conductive layer 209-3, the covering insulating layer 211-3, and the joint portion 213-3 together configure a storage unit 200A in the array area AR. The first decoupling unit 200P and the storage unit 200A may be trench capacitors. It should be noted that only one first decoupling unit 200P and one storage unit 200A are respectively correspondingly shown in the peripheral area PP and the array area AR for clarity. The number of storage unit 200A in the array area AR and the number of the first decoupling unit 200P in the peripheral area PP can be more than one.

Generally, a voltage on a power supply line may fluctuate when the transition time of the transient current is particularly short or when the power supply line's parasitic inductance or parasitic resistance is large. To ameliorate such situation, the first decoupling unit 200P may act as temporary charge reservoirs to prevent momentary fluctuations in supply voltage. In addition, the first decoupling unit 200P is formed in the substrate 101 to free up surface on the substrate for more logic components.

Figure 21:
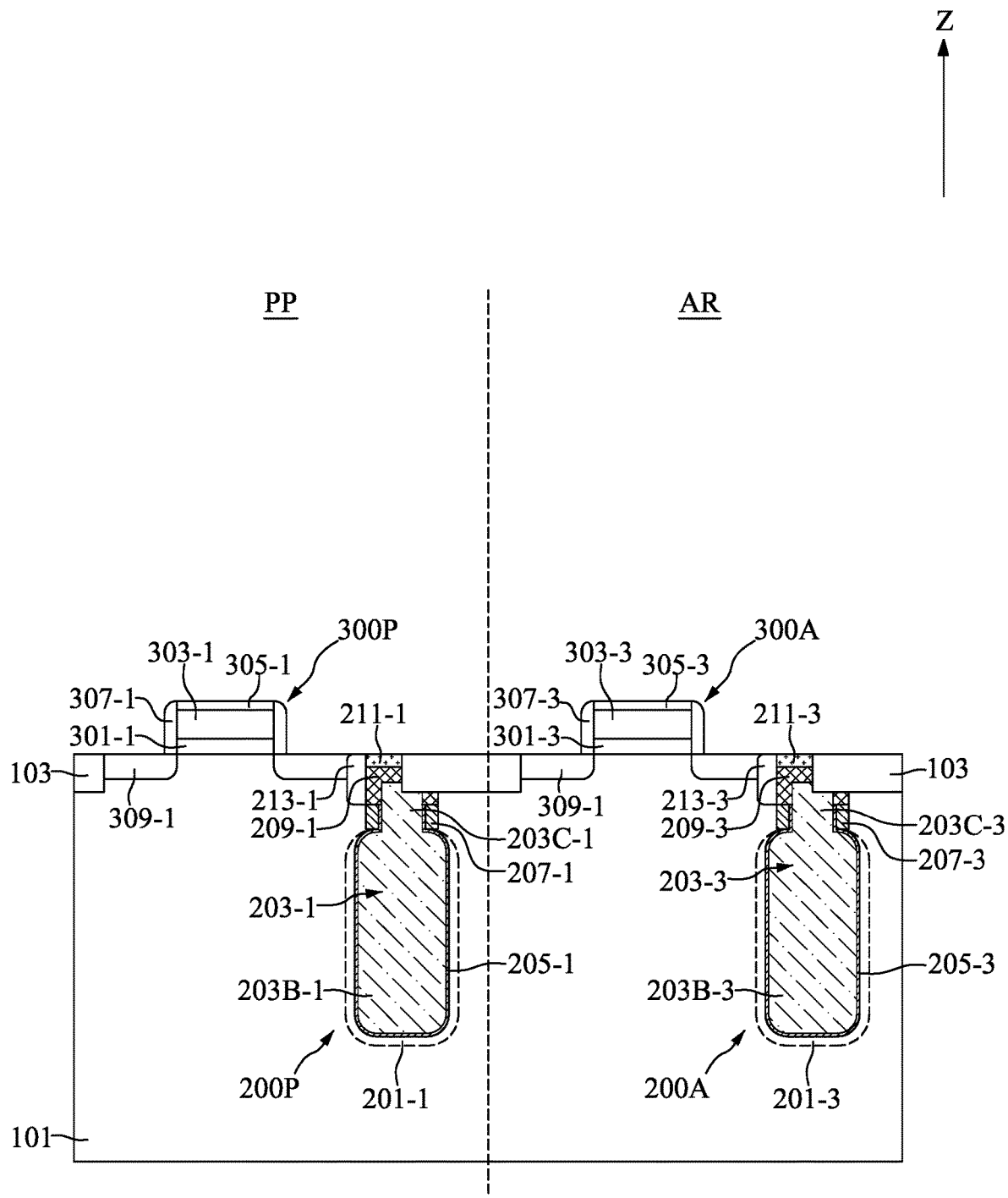

With reference to FIGS. 1 and 21, at step S17, a first switch unit 300P and a second switch unit 300A may be formed on the substrate 101.

With reference to FIG. 21, the first switch unit 300P may be formed on the peripheral area PP of the substrate 101 and may be electrically coupled to the first decoupling unit 200P through the joint portion 213-1. The second switch unit 300A may be formed on the array area AR of the substrate 101 and may be electrically coupled to the storage unit 200A through the joint portion 213-3. The first switch unit 300P and the second switch unit 300A may include gate dielectric layers 301-1, 301-3, gate bottom conductive layers 303-1, 303-3, gate top conductive layers 305-1, 305-3, gate spacers 307-1, 307-3, and impurity regions 309-1, 309-3.

With reference to FIG. 21, the gate dielectric layers 301-1, 301-3 may be formed on the peripheral area PP and the array area AR of the substrate 101, respectively. The gate dielectric layers 301-1, 301-3 may be formed of, for example, silicon oxide, silicon nitride, silicon oxynitride, silicon nitride oxide, or an insulating material having a dielectric constant of about 4.0 or greater.

With reference to FIG. 21, the gate bottom conductive layers 303-1, 303-3 may be formed on the gate dielectric layers 301-1, 301-3. The gate bottom conductive layers 303-1, 303-3 may be formed of, for example, polycrystalline silicon, doped polycrystalline silicon, polycrystalline silicon germanium, doped polycrystalline silicon germanium, the like, or a combination thereof.

With reference to FIG. 21, the gate top conductive layers 305-1, 305-3 may be formed on the gate bottom conductive layers 303-1, 303-3. The gate top conductive layers 305-1, 305-3 may be formed of, for example, titanium silicide, nickel silicide, nickel platinum silicide, tantalum silicide, or cobalt silicide.

With reference to FIG. 21, the gate spacers 307-1, 307-3 may be formed on the sidewalls of the gate top conductive layers 305-1, 305-3, the sidewalls of the gate bottom conductive layers 303-1, 303-3, and the sidewalls of the gate dielectric layers 301-1, 301-3. The gate spacers 307-1, 307-3 may be formed of, for example, silicon oxide, silicon nitride, or the like.

With reference to FIG. 21, the impurity regions 309-1 may be formed adjacent to two sides of the gate dielectric layer 301-1 and in the peripheral area PP of the substrate 101. One of the impurity regions 309-1 may be electrically connected to the joint portion 213-1. The impurity regions 309-3 may be formed adjacent to two sides of the gate dielectric layer 301-3 and in in the array area AR the substrate 101. One of the impurity regions 309-3 may be electrically connected to the joint portion 213-3. The impurity regions 309-1, 309-3 may be doped with a dopant such as phosphorus, arsenic, antimony, or boron. The impurity regions 309-1, 309-3 may have a same electrical type as the joint portions 213-1, 213-3.

In some embodiments, the first switch unit 300P may be used to control an operation status (e.g., On and Off) of the first decoupling unit 200P by changing the voltage applied to the gate top conductive layer 305-1. In some embodiments, the second switch unit 300A may be used to control an operation status (e.g., On and Off) of the storage unit 200A by changing the voltage applied to the gate top conductive layer 305-3.

Figure 23:
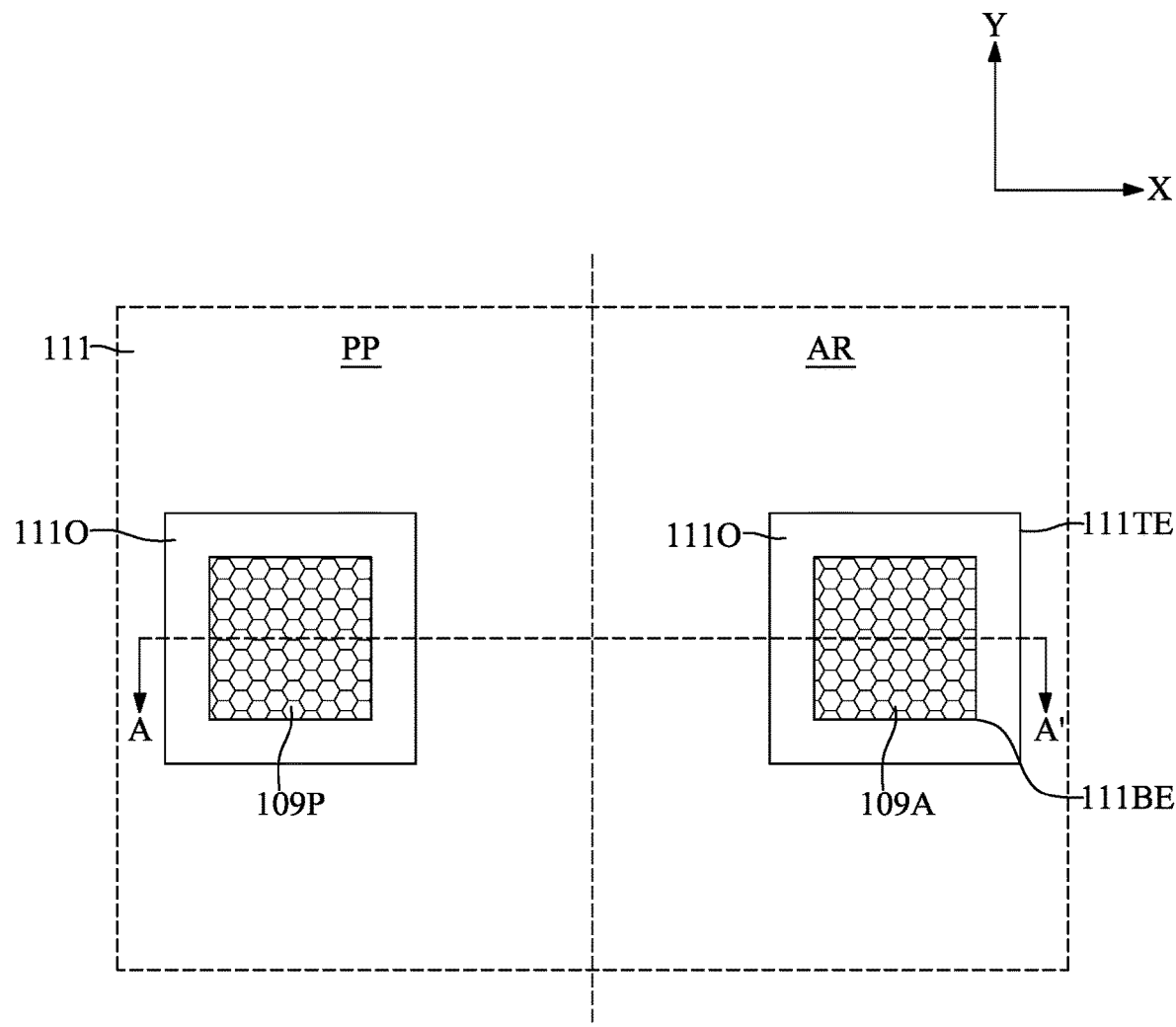
FIG. 23 illustrates, in a schematic top-view diagram, an intermediate semiconductor device in accordance with one embodiment of the present disclosure.
Figure 24:
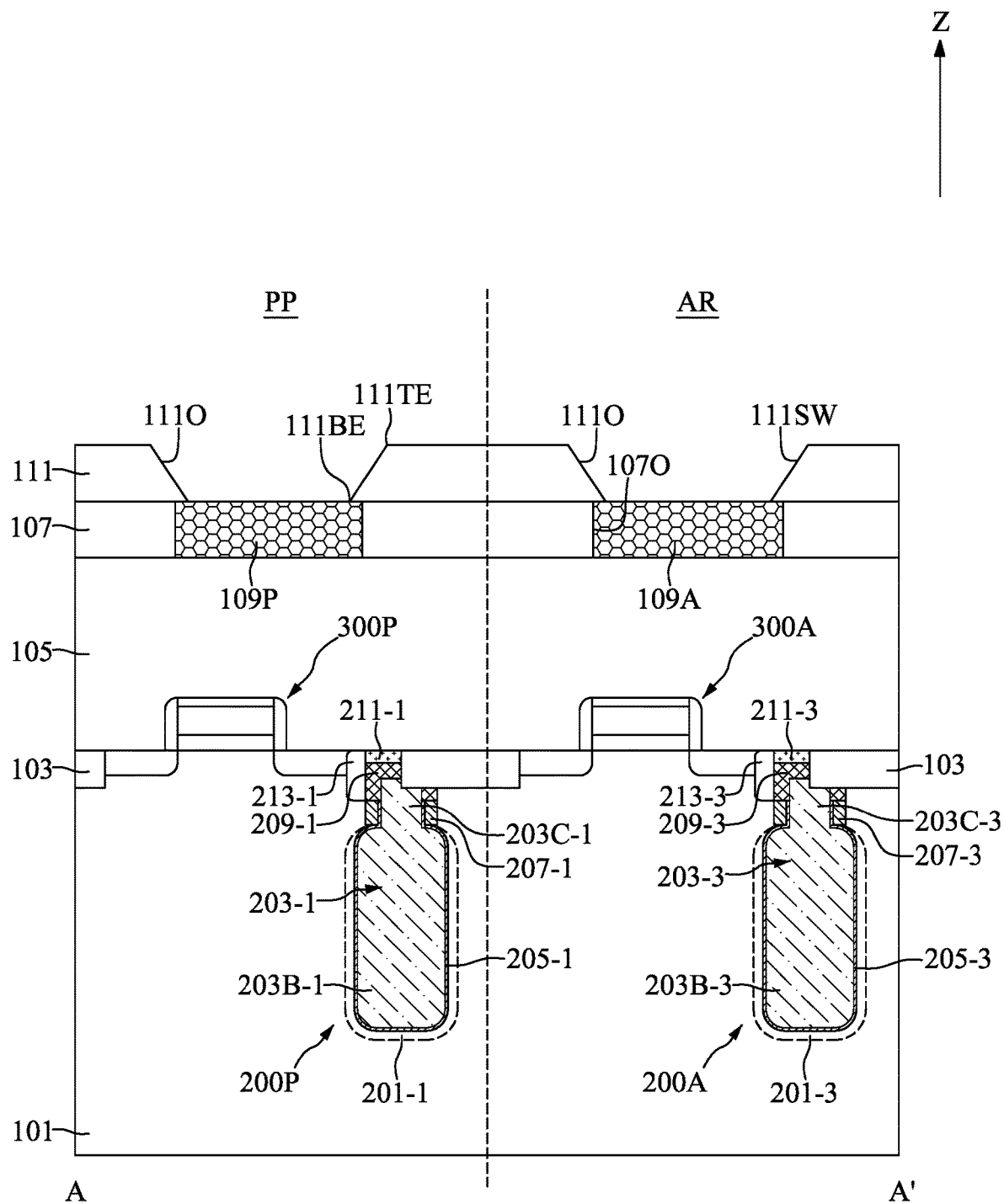
FIG. 24 is a schematic cross-sectional view diagram taken along a line A-A' in FIG. 23.

FIG. 23 illustrates, in a schematic top-view diagram, an intermediate semiconductor device in accordance with one embodiment of the present disclosure. FIG. 24 is a schematic cross-sectional view diagram taken along a line A-A' in FIG. 23.

With reference to FIG. 1 and FIGS. 22 to 24, at step S19, pad layers 109A, 109P may be formed above the substrate 101, a top passivation layer 111 may be formed on the pad layers 109A, 109P, and top passivation layer openings 111O may be formed to expose the pad layers 109A, 109P.

Figure 22:
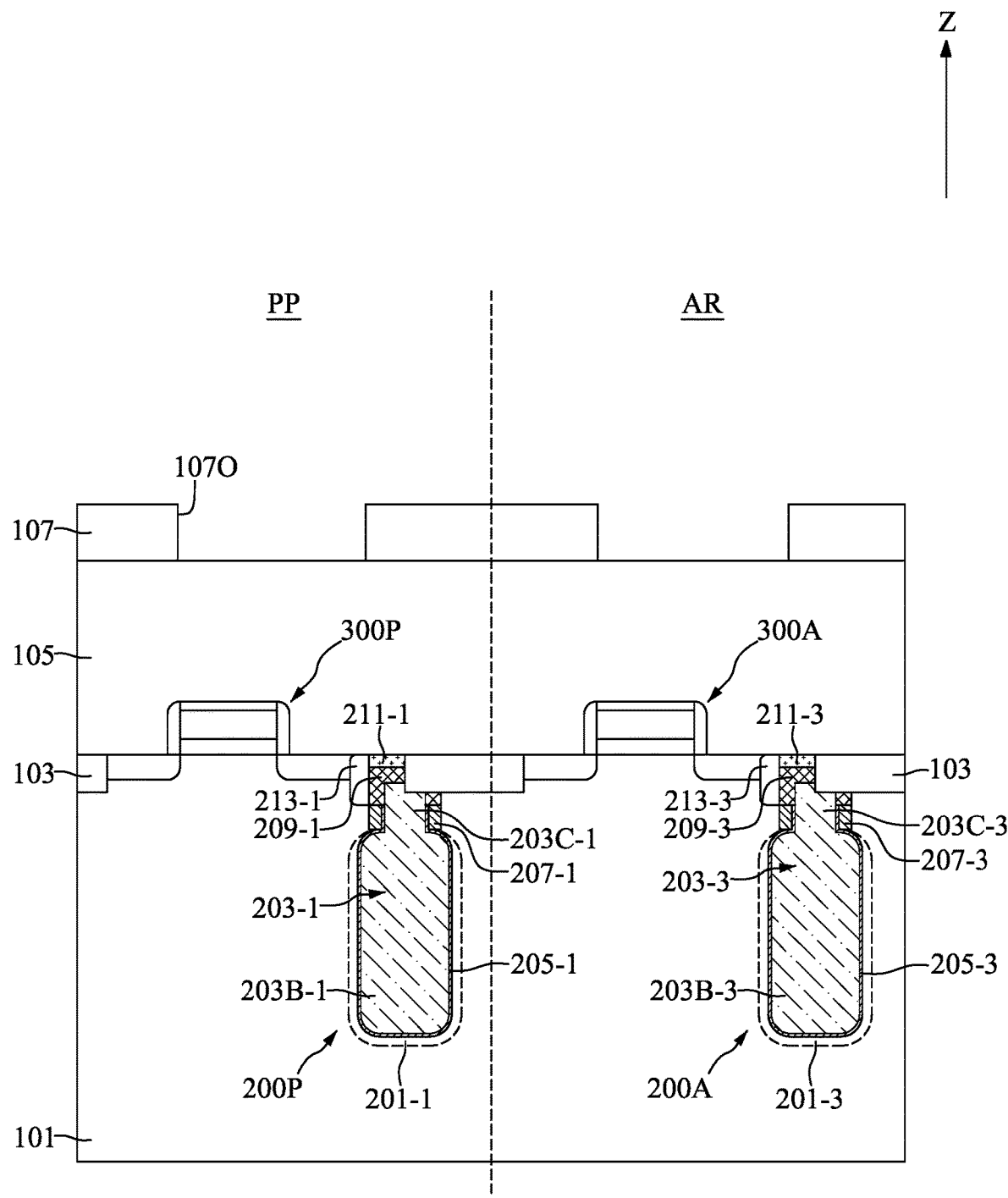

With reference to FIG. 22, an interconnection layer 105 may be formed on the substrate 101 and may cover the first switch unit 300P and the second switch unit 300A. The interconnection layer 105 may include dielectrics, insulating layers, and conductive features. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. The conductive features may be conductive lines, conductive vias, conductive contacts, or the like. The dielectrics or the insulating layers may act as an insulator that supports and electrically isolates the conductive features.

With reference to FIG. 22, a bottom passivation layer 107 may be formed on the interconnection layer 105. In some embodiments, the bottom passivation layer 107 may be formed of, for example, silicon oxide or phosphosilicate glass. The bottom passivation layer 107 may serve as a stress buffer between the interconnection layer 105 and the top passivation layer 111 as will be illustrated later. In some embodiments, the bottom passivation layer 107 may be formed of, for example, silicon oxide, silicon nitride, silicon oxynitride, silicon oxide nitride, polyimide, polybenzoxazole, phosphosilicate glass, undoped silica glass, or fluoride silicate glass. Bottom passivation layer openings 107O may be formed along the bottom passivation layer 107 to expose portions of the top surface of the interconnection layer 105.

In some embodiments, a cleaning process and a passivation process may be performed on the bottom passivation layer openings 107O. The cleaning process may remove oxide, originating from oxidation by oxygen in the air, from the top surface of the topmost conductive feature of interconnection layer 105 without damaging thereof. The cleaning process may include applying a mixture of hydrogen and argon as a remote plasma source onto the bottom passivation layer openings 107O. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the bottom passivation layer 107 exposed through the bottom passivation layer openings 107O by sealing surface pores thereof. Undesirable sidewall growth, which may affect the electric characteristics of the semiconductor device 1A, may be reduced by the passivation process. As a result, the performance and reliability of the semiconductor device 1A may be increased.

With reference to FIGS. 23 and 24, the pad layer 109P may be formed in the bottom passivation layer opening 107O above the peripheral area PP of the substrate 101. In some embodiments, the pad layer 109P may be electrically coupled to the first decoupling unit 200P through the conductive features of the interconnection layer 105 and the first switch unit 300P. The pad layer 109A may be formed in the bottom passivation layer opening 107O above the array area AR of the substrate 101. In some embodiments, the pad layer 109A may be electrically coupled to the storage unit 200A through the conductive features of the interconnection layer 105 and the second switch unit 300A. In some embodiments, the pad layers 109A, 109P may be stacked layer including bottom layers and top layers. The bottom layers may be formed on the interconnection layer 105 and may include nickel. The top layers may be formed on the bottom layers and may include palladium, cobalt, or a combination thereof.

With reference to FIGS. 23 and 24, the top passivation layer 111 may be formed on the bottom passivation layer 107. The top passivation layer openings 111O may be formed along the top passivation layer 111 by a photolithography process and a subsequently etch process. Portions of the top surfaces of the pad layers 109A, 109P may be exposed through the top passivation layer openings 111O. In some embodiments, the top passivation layer openings 111O may include tapered sidewalls 111SW. In some embodiments, each of the tapered sidewalls 111SW may extend from the bottom edges 111BE of the top passivation layer openings 111O to the top edges 111TE of the top passivation layer openings 111O in a cross-sectional perspective. Each of the bottom edges 111BE of the top passivation layer openings 111O may have a rectangular shape, and each of the top edges 111TE of the top passivation layer openings 111O may also have a rectangular shape in a top-view perspective. The bottom edges 111BE of the top passivation layer openings 111O may define exposed regions of the top surfaces of the pad layers 109A, 109P.

Figure 25:
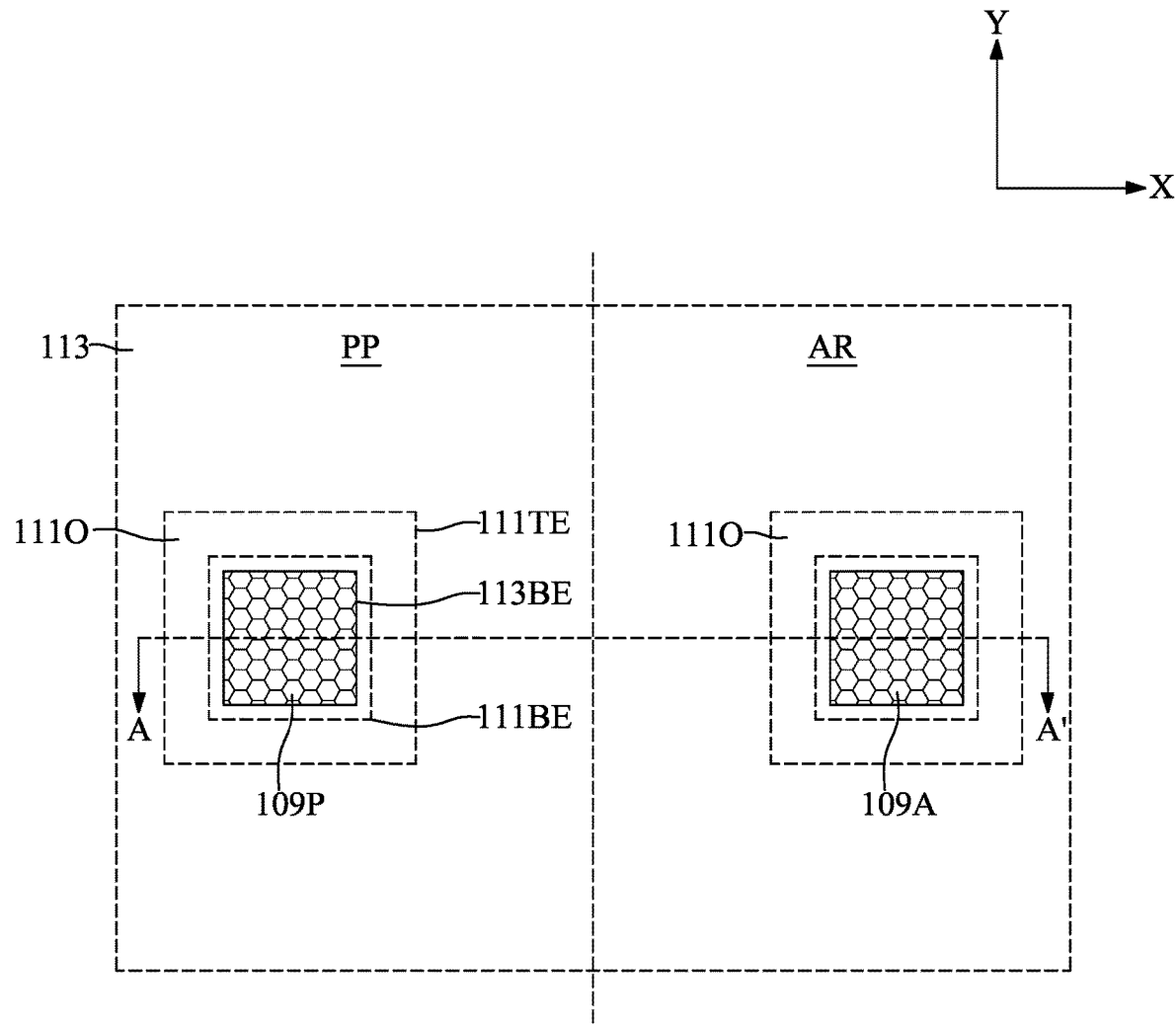
FIG. 25 illustrates, in a schematic top-view diagram, an intermediate semiconductor device in accordance with one embodiment of the present disclosure.
Figure 26:
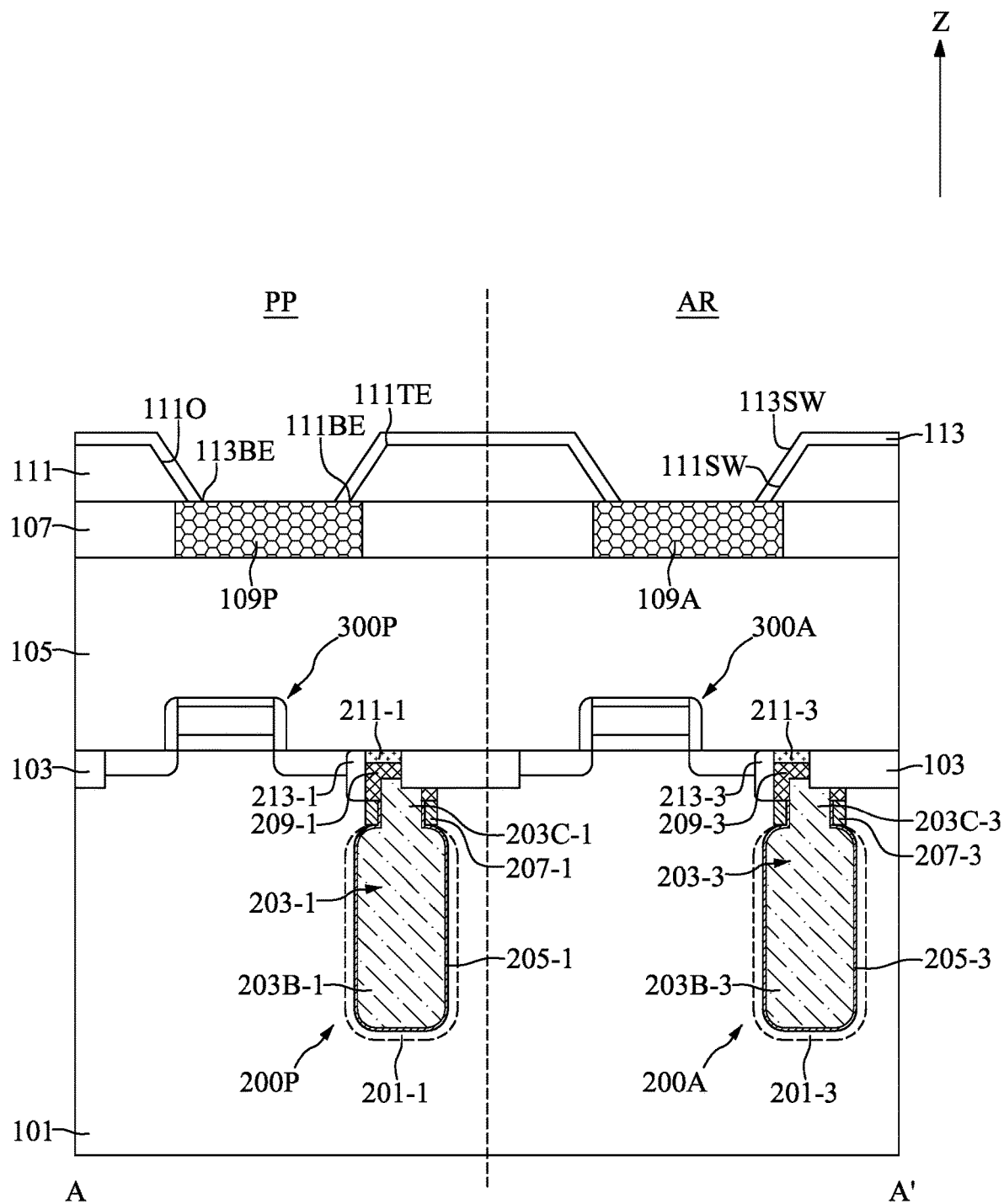
FIG. 26 is a schematic cross-sectional view diagram taken along a line A-A' in FIG. 25.

FIG. 25 illustrates, in a schematic top-view diagram, an intermediate semiconductor device in accordance with one embodiment of the present disclosure. FIG. 26 is a schematic cross-sectional view diagram taken along a line A-A' in FIG. 25.

With reference to FIG. 1 and FIGS. 25 and 26, at step S21, a pad dielectric layer 113 may be formed on the top passivation layer 111 to expose the pad layers 109A, 109P.

With reference to FIGS. 25 and 26, the pad dielectric layer 113 may be conformally formed on the top passivation layer 111 to reveal the exposed top surfaces of the pad layers 109A, 109P. The pad dielectric layer 113 may conformally cover the tapered sidewalls 111SW to form corresponding tapered sidewalls 113SW. The bottom edges 113BE of the pad dielectric layer 113 may extend to cover the bottom edges 111E of the top passivation layer openings 111O and to contact the edges of the exposed top surfaces of the pad layers 109A, 109P. In some embodiments, the pad dielectric layer 113 may be formed to include a photosensitive polymer material, such as a polyimide material. In some embodiments, the pad dielectric layer 113 may be formed of, for example, silicon oxide, silicon nitride, silicon carbon nitride, silicon nitride oxide, or silicon oxynitride. The pad dielectric layer 113 may provide additional electrically isolate or insulate to the conductive features underlying thereof and the conductive features above thereof.

Figure 27:
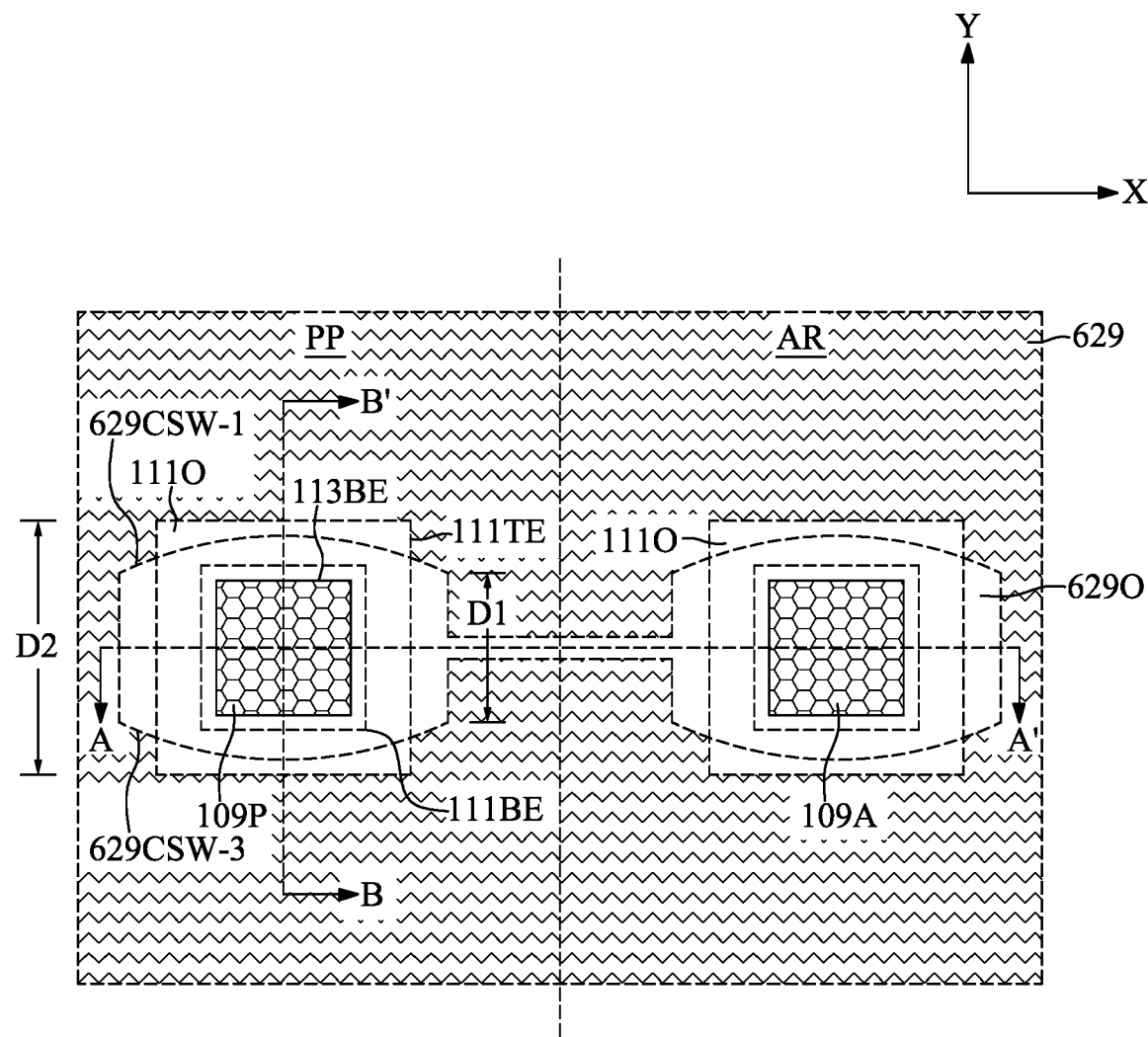
FIG. 27 illustrates, in a schematic top-view diagram, an intermediate semiconductor device in accordance with one embodiment of the present disclosure.
Figure 28:
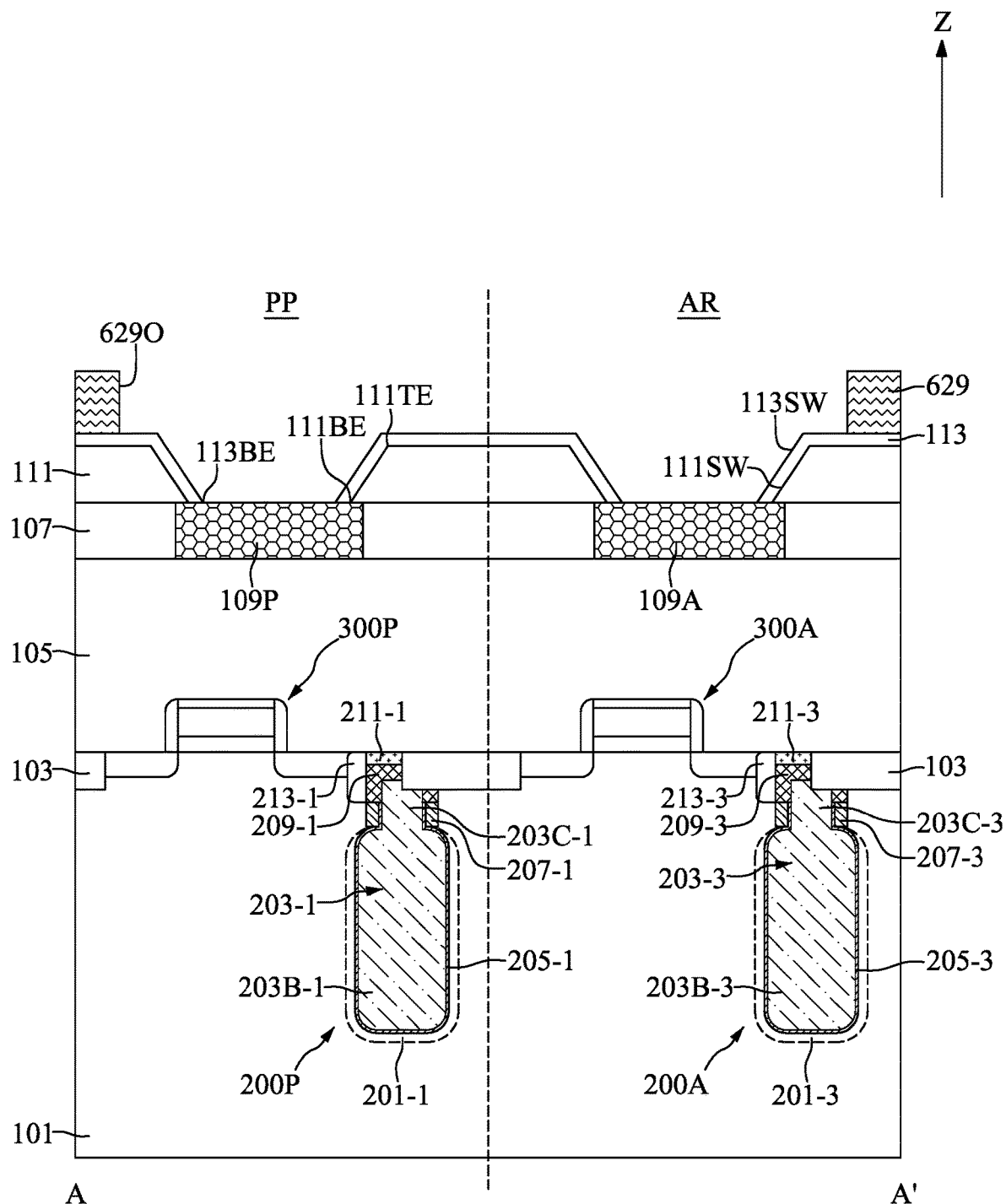
FIG. 28 is a schematic cross-sectional view diagram taken along a line A-A' in FIG. 27.
Figure 29:
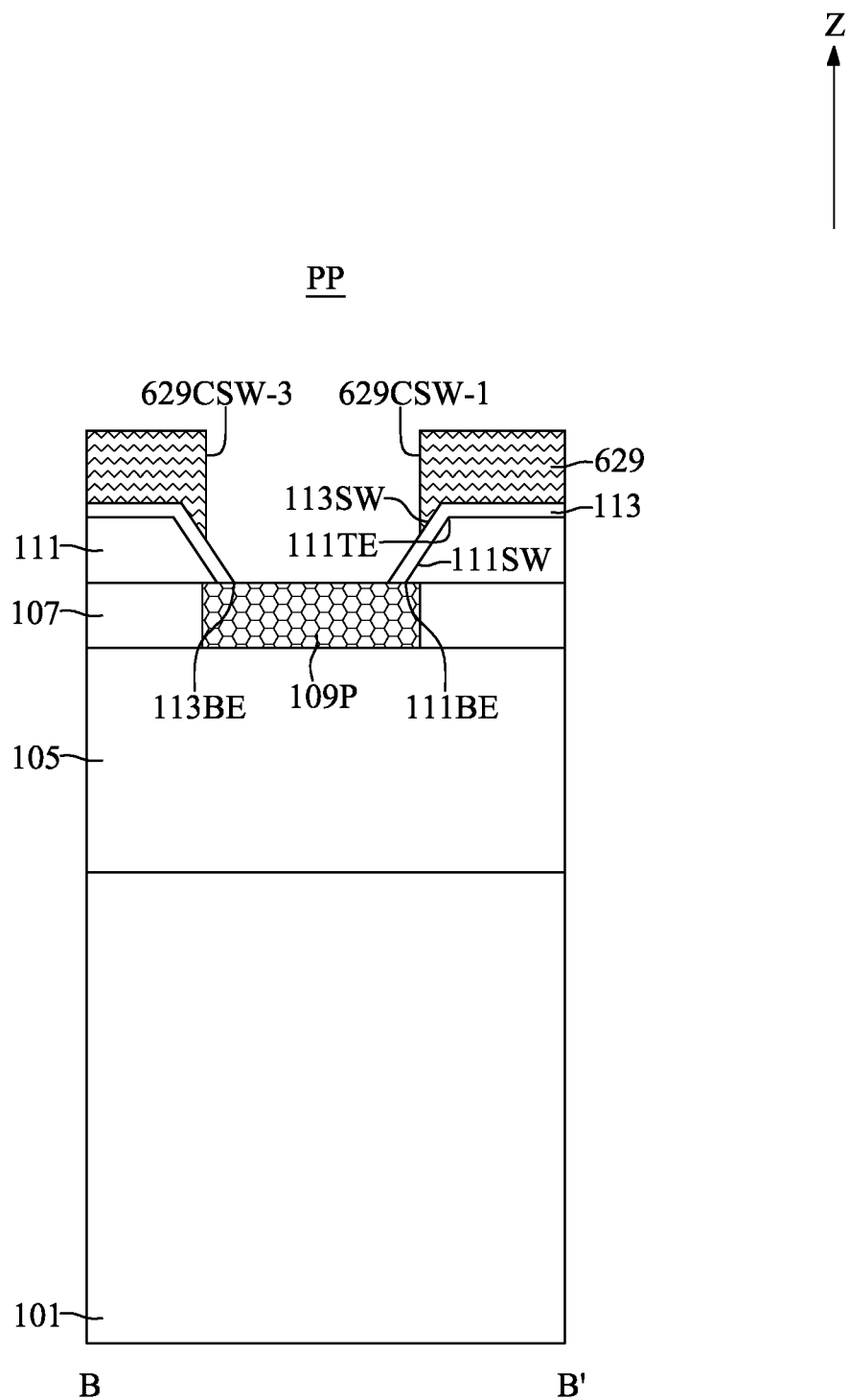
FIG. 29 is a schematic cross-sectional view diagram taken along a line B-B' in FIG. 27.

FIG. 27 illustrates, in a schematic top-view diagram, an intermediate semiconductor device in accordance with one embodiment of the present disclosure. FIG. 28 is a schematic cross-sectional view diagram taken along a line A-A' in FIG. 27. FIG. 29 is a schematic cross-sectional view diagram taken along a line B-B' in FIG. 27. Some elements are omitted in FIG. 29 for clarity.

With reference to FIG. 1 and FIGS. 27 to 29, at step S23, a first mask layer 629 may be formed on the pad dielectric layer 113 and a mask opening 629O may be formed along the first mask layer 629.

With reference to FIGS. 27 to 29, the first mask layer 629 may be a photoresist layer. The mask opening 629O may define the pattern of a redistribution structure 401 as will be illustrated later. In a top-view perspective, the mask opening 629O may have a shape of dumbbell.

With reference to FIGS. 27 to 29, in a top-view perspective, each of two ends of the mask opening 629O may include a first curved sidewall 629CSW-1 and a second curved sidewall 629CSW-3 which are arranged horizontally. The first curved sidewall 629CSW-1 may have a convex shape. The second curved sidewall 629CSW-3 may have a concave shape. The vertical distances parallel to the direction Y between the first curved sidewall 629CSW-1 and the second curved sidewall 629CSW-3 may vary between a relatively narrow distance D1 to a relatively wide distance D2 along the direction X perpendicular to the direction Y.

The portion of the mask opening 629O having relatively narrow distance D1 may provide additional structural support to the first mask layer 629 to against collapse or deformation. In contrast, the portion of the mask opening 629O having relatively wide distance D2 may have relative low resistance against collapse or deformation. That is, the portion of the mask opening 629O having relatively wide distance D2 may be relatively fragile. However, the aforementioned structural support may compensate the relatively fragile portion, the collapse or the deformation of the first mask layer 629 may be suppressed or reduced. That is, the first mask layer 629 and the mask opening 629O may be structural stable even some portions of the mask opening 629O are locate on the tapered sidewalls 113SW of the pad dielectric layer 113 as in FIG. 29. As a result, the redistribution structure 401 may have a larger planar area which indicating less surface resistivity and better electrical transmitting performance.

Figure 30:
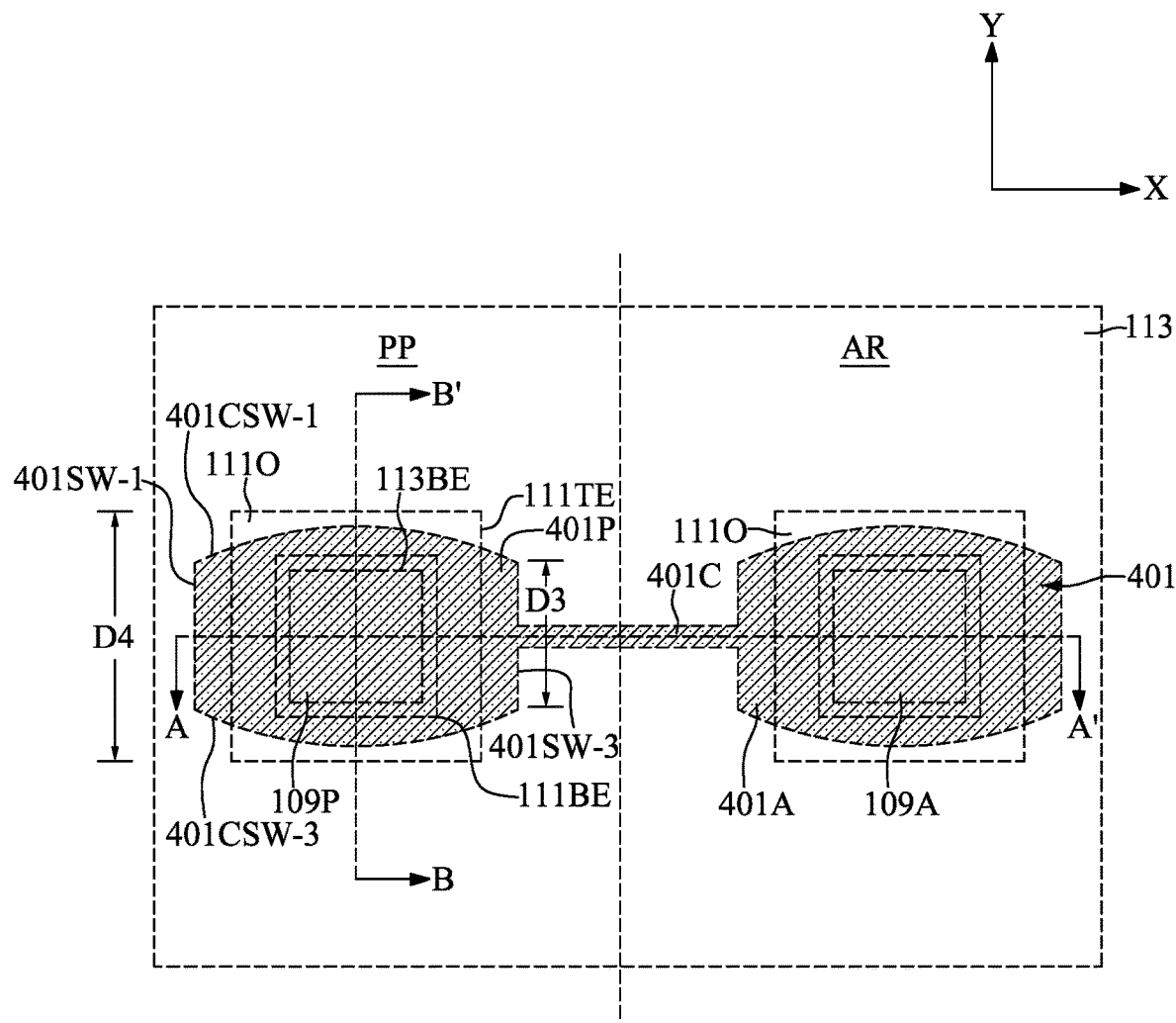
FIG. 30 illustrates, in a schematic top-view diagram, an intermediate semiconductor device in accordance with one embodiment of the present disclosure.
Figure 31:
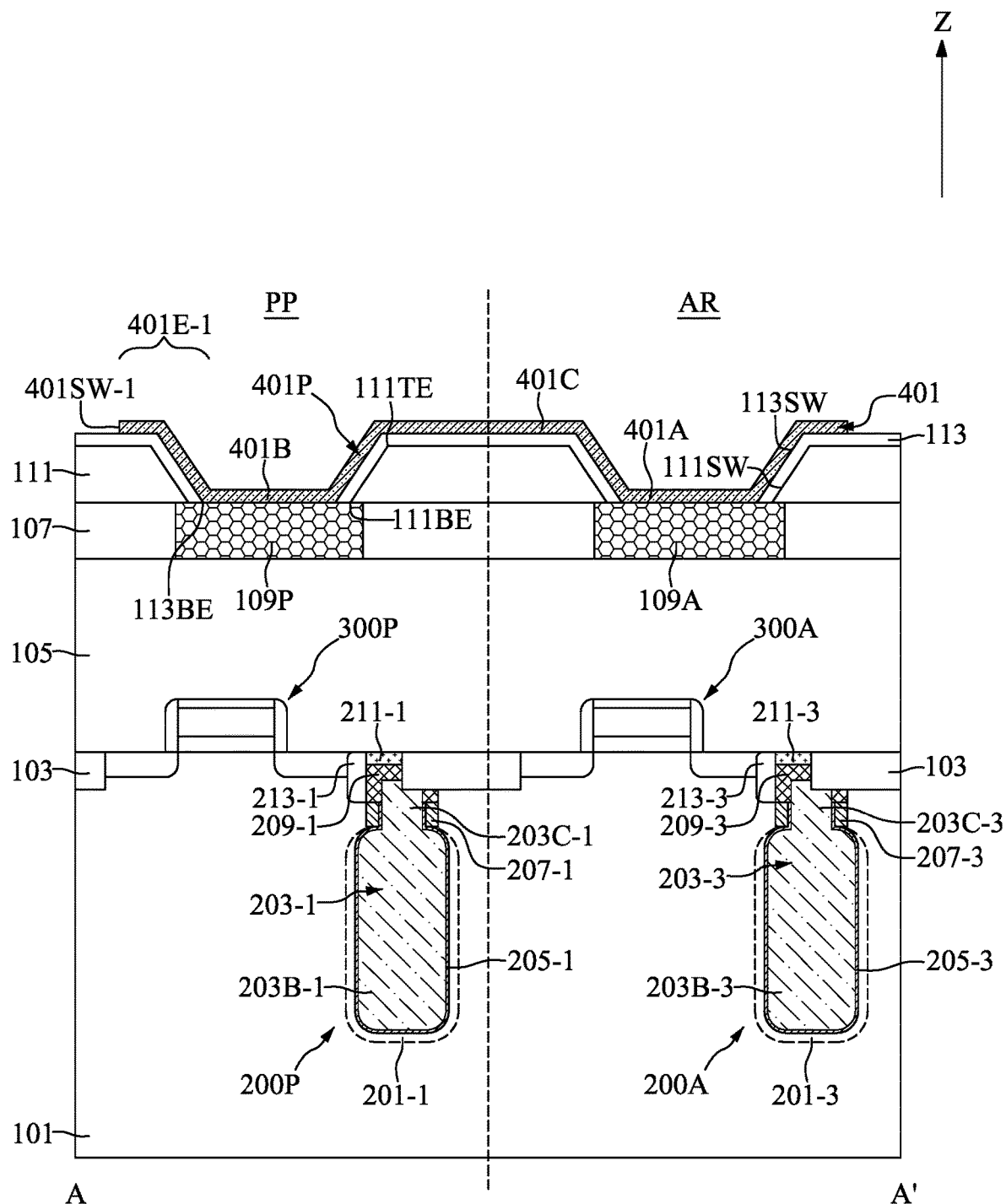
FIG. 31 is a schematic cross-sectional view diagram taken along a line A-A' in FIG. 30.
Figure 32:
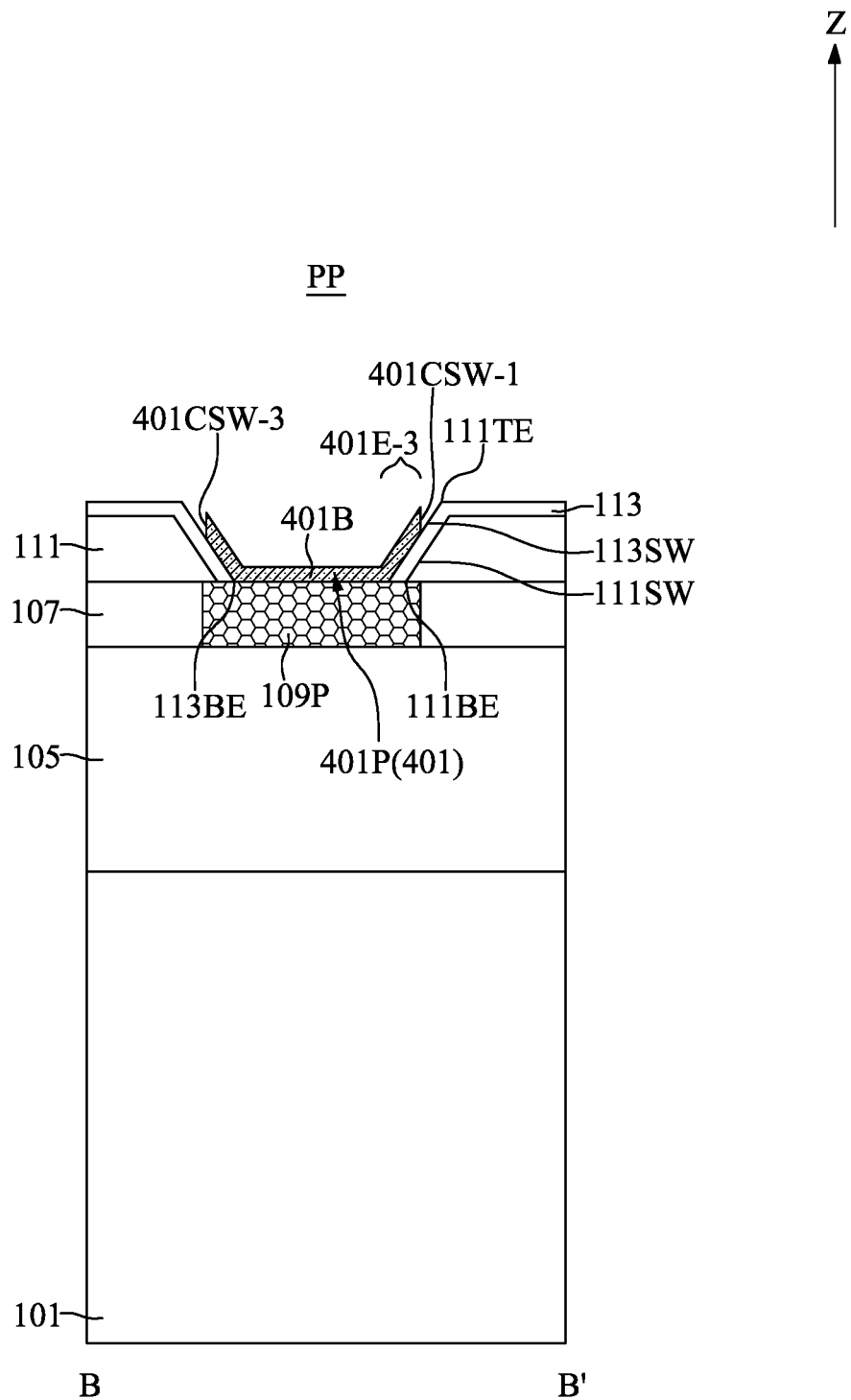
FIG. 32 is a schematic cross-sectional view diagram taken along a line B-B' in FIG. 30.

FIG. 30 illustrates, in a schematic top-view diagram, an intermediate semiconductor device in accordance with one embodiment of the present disclosure. FIG. 31 is a schematic cross-sectional view diagram taken along a line A-A' in FIG. 30. FIG. 32 is a schematic cross-sectional view diagram taken along a line B-B' in FIG. 30. Some elements are omitted in FIG. 32 for clarity.

With reference to FIG. 1 and FIGS. 30 to 32, at step S25, the redistribution structure 401 may be formed in the mask opening 629O.

With reference to FIGS. 30 to 32, the redistribution structure 401 may be formed in the mask opening 629O and electrically coupled to the pad layers 109A, 109P. The first mask layer 629 may be removed after the formation of the redistribution structure 401. The redistribution structure 401 may be formed of, for example, tungsten, titanium, tin, nickel, copper, gold, aluminum, platinum, cobalt, or a combination thereof. In a top-view perspective, the redistribution structure 401 may be a conductive pattern that extends from the array area AR to the peripheral area PP. In some embodiments, the redistribution structure 401 may include a peripheral portion 401P, a connection portion 401C, and an array portion 401A. The peripheral portion 401P may be formed above the peripheral area PP of the substrate 101. The array portion 401A may be formed above the array area AR of the substrate 101. The connection portion 401C may connect the peripheral portion 401P and the array portion 401A.

With reference to FIGS. 30 to 32, in a top-view perspective, the peripheral portion 401P may include a first curved sidewall 401CSW-1, a second curved sidewall 401CSW-3, a first flat sidewall 401SW-1, and a second flat sidewall 401SW-3. The first curved sidewall 401CSW-1 may be horizontally arranged and may have a convex shape. The second curved sidewall 401CSW-3 may be opposite to the first curved sidewall 401CSW-1 and may have a concave shape. The vertical distances parallel to the direction Y between the first curved sidewall 401CSW-1 and the second curved sidewall 401CSW-3 may vary between a relatively narrow distance D3 to a relatively wide distance D4 along the direction X. The first flat sidewall 401SW-1 may connect a first edge of the first curved sidewall 401CSW-1 to a first edge of the second curved sidewall 401CSW-3. The second flat sidewall 401SW-3 may connect a second edge of the first curved sidewall 401CSW-1 to a second edge of the second curved sidewall 401CSW-3. The first flat sidewall 401SW-1 and the second flat sidewall 401SW-3 may be parallel with the direction Y. The connection portion 401C may be connected to the second flat sidewall 401SW-3.

With reference to FIGS. 30 to 32, in a cross-sectional perspective, the first curved sidewall 401CSW-1 may be located to overlap with the tapered sidewalls 113SW between the top edge 111TE and the bottom edge 111BE. Although most of the first curved sidewall 401CSW-1 is formed to overlap with the tapered sidewalls 113SW, both of the first edge and the second edge of the first curved sidewall 401CSW-1 may be located out of the top edge 111TE to overlap with the flat top surface of the pad dielectric layer 113.

With reference to FIG. 31, the peripheral portion 401P may include a first extension part 401E-1 that extends from a bottom part 401B of the peripheral portion 401P to the first flat sidewall 401SW-1. The first extension part 401E-1 may extend onto an outside region of the tapered sidewalls 113SW to overlap with the flat top surface of the pad dielectric layer 113. The bottom part 401B may be a part of the peripheral portion 401P that is in direct contact with the pad layer 109P.

With reference to FIG. 32, in a cross-sectional perspective, the peripheral portion 401P may include a second extension part 401E-3 that extends from the bottom part 401B of the peripheral portion 401P to the first curved sidewall 401CSW-1.

With reference to FIGS. 30 to 32, the first extension segment 401E-1 and the second extension segment 402E-3 may cover both the bottom edge 113BE and the bottom edge 111BE. Thus, even though the peripheral portion 401P is shifted from a normal position due to a process variation or the like, the pad layer 109P may be still covered with the peripheral portion 401P. That is, an overlap margin between the peripheral portion 401P and the pad layer 109P may increase to significantly suppress or reduce a failure that the pad layer 109P is exposed after the peripheral portion 401P is formed. It should be noted that the array portion 401A may have a structure similar with the peripheral portion 401P.

Figure 33:
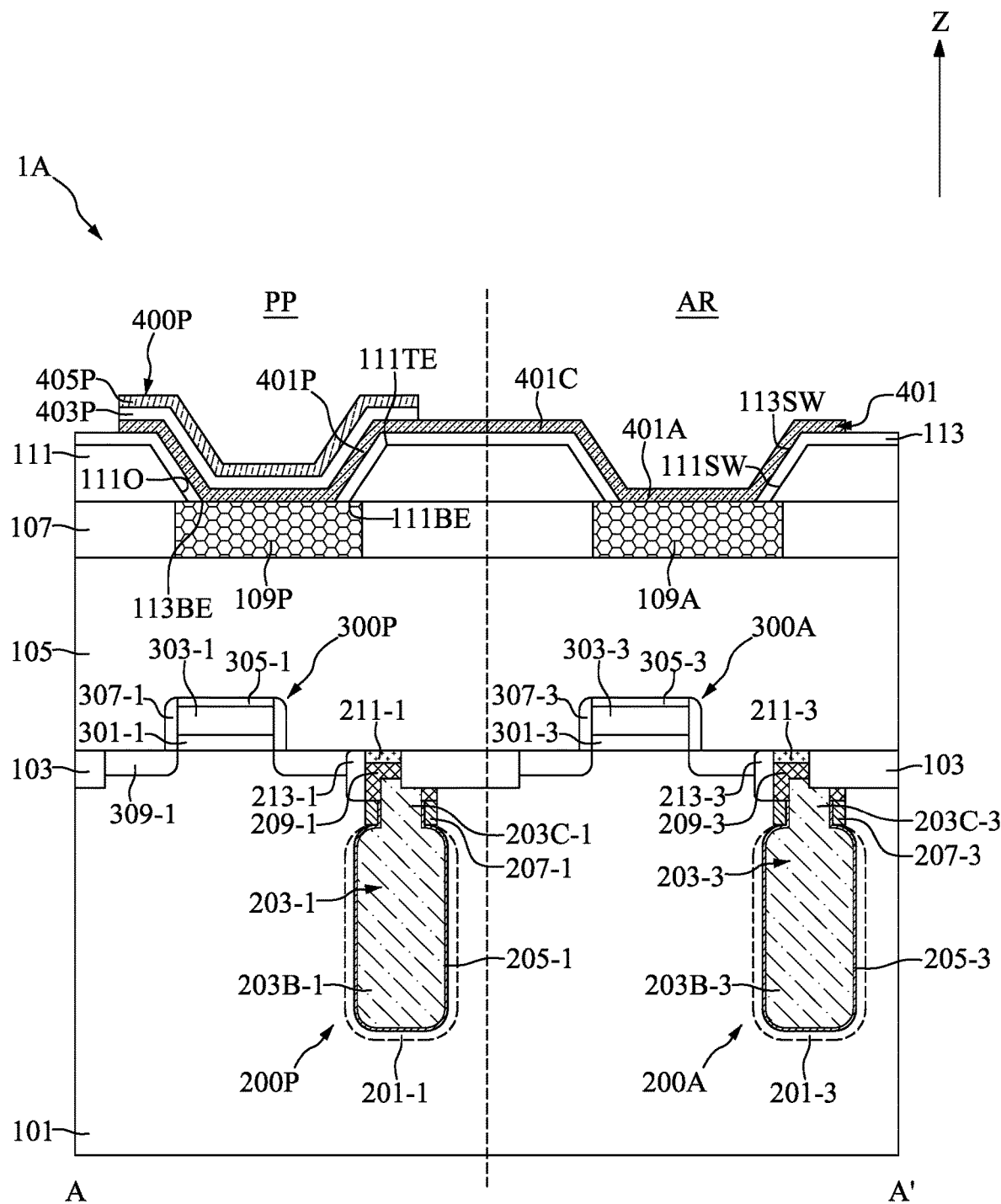
FIG. 33 is a schematic cross-sectional view diagram taken along the line A-A' in FIG. 30 illustrating part of the flow for fabricating the semiconductor device in accordance with one embodiment of the present disclosure.

FIG. 33 is a schematic cross-sectional view diagram taken along the line A-A' in FIG. 30 illustrating part of the flow for fabricating the semiconductor device 1A in accordance with one embodiment of the present disclosure.

With reference to FIGS. 1 and 33, at step S27, a middle insulating layer 403P may be formed on the redistribution structure 401 and a top conductive layer 405P may be formed on the middle insulating layer 403P.

With reference to FIG. 33, the middle insulating layer 403P may be formed on the peripheral portion 401P of the redistribution structure 401. The middle insulating layer 403P may have a thickness between about 5 nm and about 100 nm. The middle insulating layer 403P may be formed of, for example, silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof.

With reference to FIG. 33, the top conductive layer 405P may be formed on the middle insulating layer 403P. The width of the top conductive layer 405P may be equal to the width of the middle insulating layer 403P. In some embodiments, the top conductive layer 405P may be formed of, for example, silicon, germanium, doped silicon, doped silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

With reference to FIG. 33, the redistribution structure 401, the middle insulating layer 403P, and the top conductive layer 405P together form a second decoupling unit 400P. Specifically, the peripheral portion 401P of the redistribution structure 401, the middle insulating layer 403P, and the top conductive layer 405P together form the second decoupling unit 400P. In some embodiments, the second decoupling unit 400P may be electrically coupled to the first switch unit 300P through the pad layer 109P and the conductive features of the interconnection layer 105. In some embodiments, the second decoupling unit 400P may be electrically coupled to the first decoupling unit 200P through the pad layer 109P, the conductive features of the interconnection layer 105, and the first switch unit 300P. The second decoupling unit 400P may act as temporary charge reservoirs to prevent momentary fluctuations in supply voltage. As a result, the reliability of the semiconductor device 1A may be improved.

FIGS. 34 to 38 illustrate, in schematic cross-sectional view diagrams, semiconductor devices 1B, 1C, 1D, 1E, and 1F in accordance with some embodiments of the present disclosure.

Figure 34:
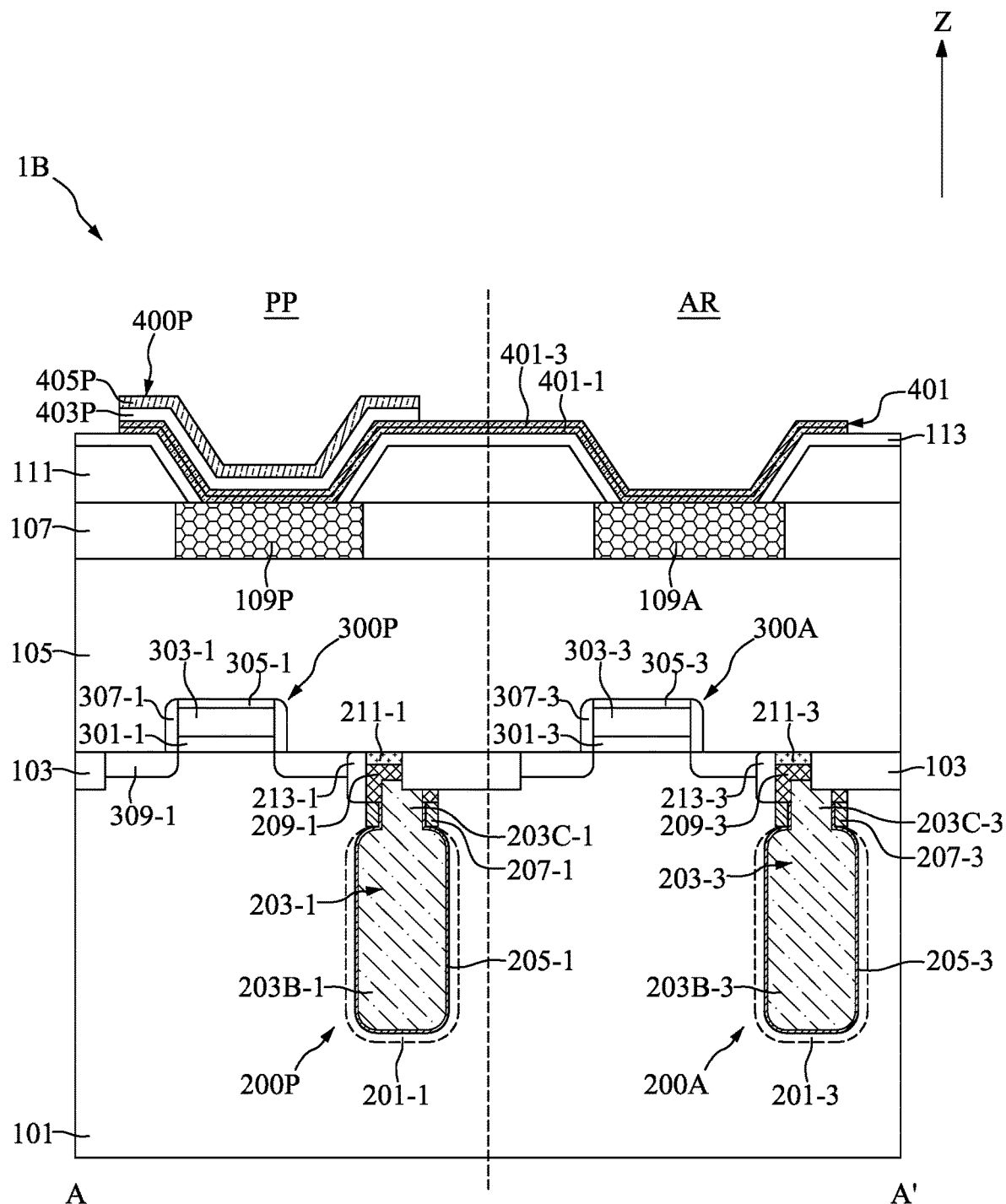
FIGS. 34 to 38 illustrate, in schematic cross-sectional view diagrams, semiconductor devices in accordance with some embodiments of the present disclosure.

With reference to FIG. 34, the semiconductor device 1B may have a structure similar to that illustrated in FIG. 33. The same or similar elements in FIG. 34 as in FIG. 33 have been marked with similar reference numbers and duplicative descriptions have been omitted.

With reference to FIG. 34, the redistribution structure 401 may be a stacked layer including a seed layer 401-1 and a plating layer 401-3. The seed layer 401-1 may be conformally disposed on the pad layers 109A, 109P and on the pad dielectric layer 113. The plating layer 401-3 may be disposed on the seed layer 401-1. The plating layer 401-3 may be formed of, for example, tungsten, titanium, tin, nickel, copper, gold, aluminum, platinum, cobalt, or a combination thereof.

Figure 35:
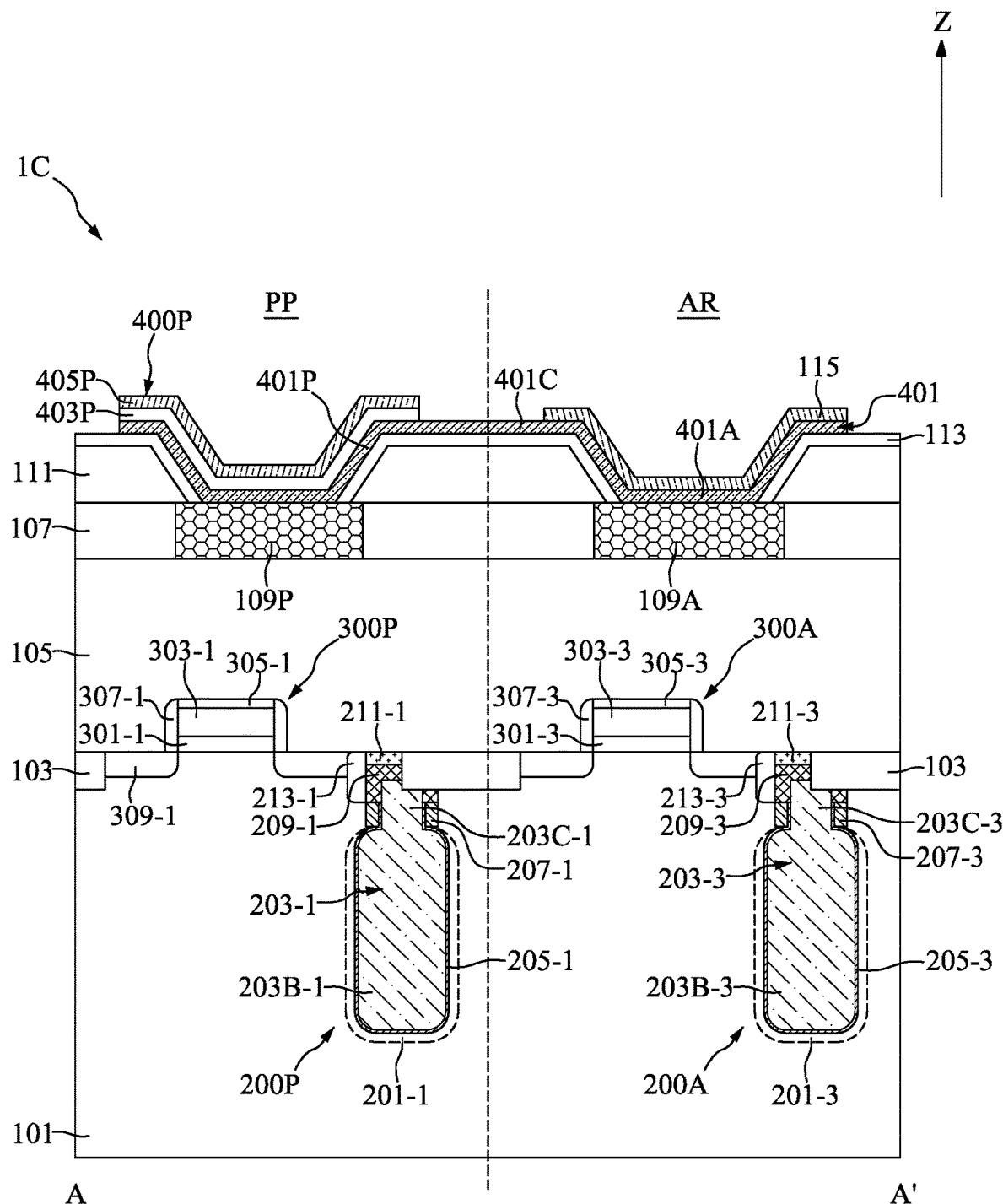

With reference to FIG. 35, the semiconductor device 1C may have a structure similar to that illustrated in FIG. 33. The same or similar elements in FIG. 35 as in FIG. 33 have been marked with similar reference numbers and duplicative descriptions have been omitted.

With reference to FIG. 35, a thermal release layer 115 may be formed on the redistribution structure 401. Specifically, the thermal release layer 115 may be formed on the array portion 401A of the redistribution structure 401. The thermal release layer 115 may be formed of a carbon material that is imbued with a flexible material such as a polymer matrix. For example, the thermal release layer 115 may include generally vertically oriented graphite and carbon nanotubes, which are imbued with a fluoropolymer rubber matrix. The aspect ratio of the carbon nanotubes may be between about 1:1 and about 1:100. For another example, the thermal release layer 115 may include graphitic carbon.

In some embodiments, a thermal resistance of the thermal release layer 115 may be less than 0.2° C. cm$^2$/Watt at a thickness between about 250 µm and about 450 µm. In some embodiments, the thermal resistance of the thermal release layer 115 may be between about between about 0.04° C. cm$^2$/Watt and about 0.25° C. cm$^2$/Watt. The thermal release layer 115 may improve thermal dissipation capability to the redistribution structure 401. In some embodiments, the thermal release layer 115 may be formed on the top conductive layer 405P and may provide thermal dissipation capability to the second decoupling unit 400P.

Figure 36:
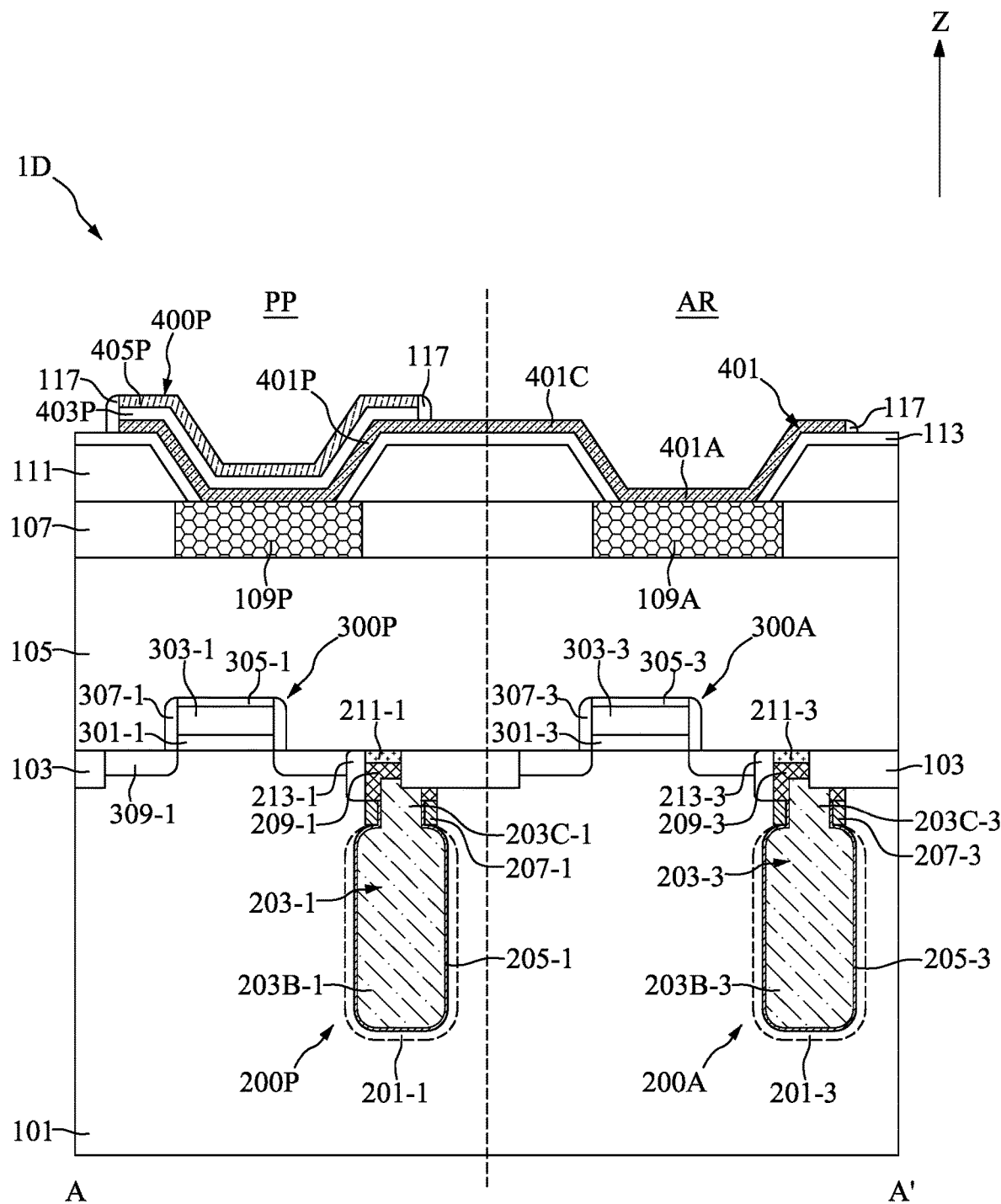

With reference to FIG. 36, the semiconductor device 1D may have a structure similar to that illustrated in FIG. 33.

The same or similar elements in FIG. 36 as in FIG. 33 have been marked with similar reference numbers and duplicative descriptions have been omitted.

With reference to FIG. 36, top spacers 117 may be formed on sidewalls of the top conductive layer 405P, sidewalls of the middle insulating layer 403P, and sidewalls of the redistribution structure 401. The top spacers 117 may be formed of, for example, silicon oxide, silicon nitride, silicon carbon nitride, silicon nitride oxide, or silicon oxynitride. The top spacers 117 may provide additional electrically isolate or insulate to the redistribution structure 401 and the second decoupling unit 400P.

Figure 37:
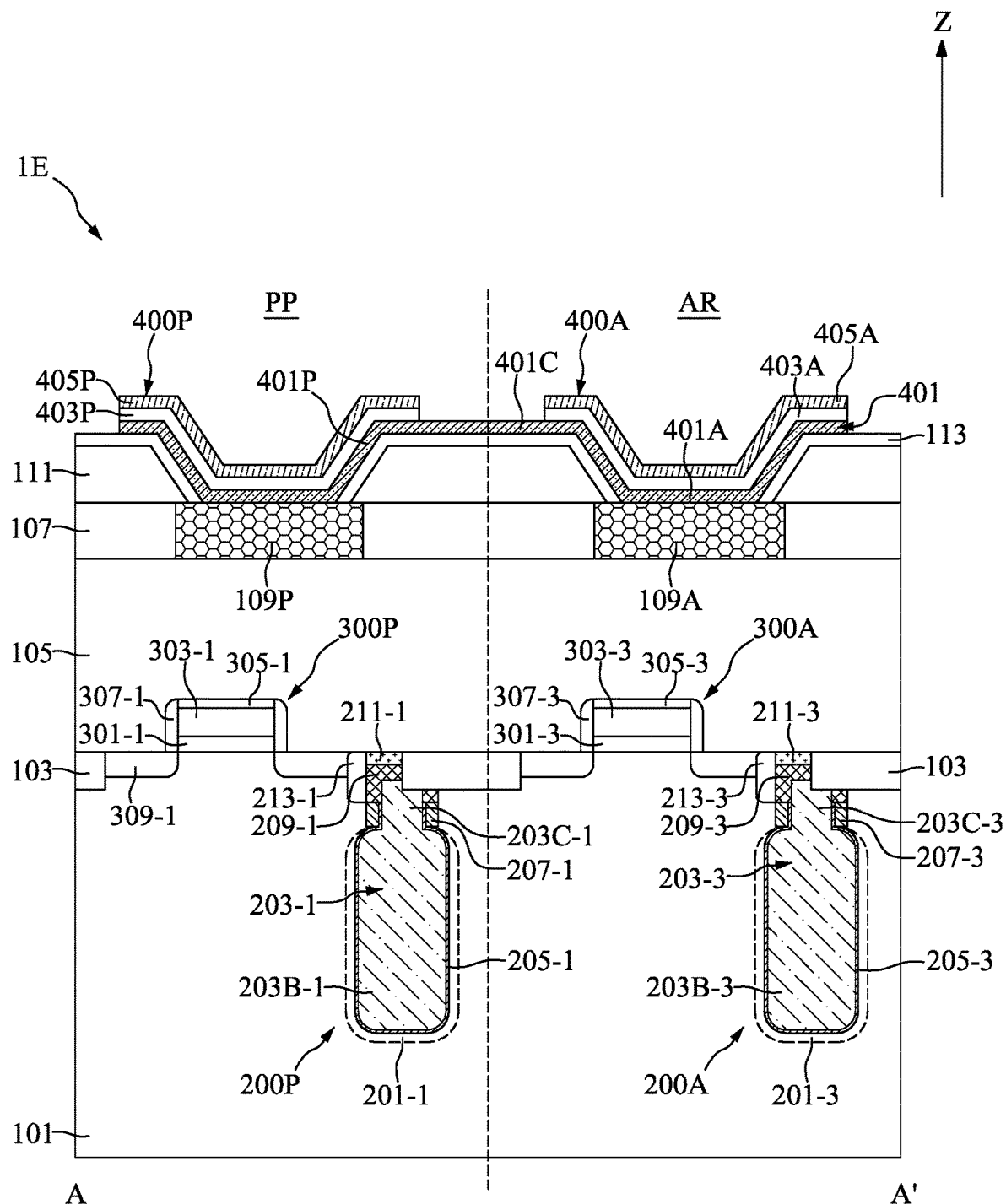

With reference to FIG. 37, the semiconductor device 1E may have a structure similar to that illustrated in FIG. 33. The same or similar elements in FIG. 37 as in FIG. 33 have been marked with similar reference numbers and duplicative descriptions have been omitted.

With reference to FIG. 37, a middle insulating layer 403A may be formed on the array portion 401A of the redistribution structure 401. A top conductive layer 405A may be formed on the middle insulating layer 403A. The middle insulating layer 403A may be formed of a same material as the middle insulating layer 403P. The top conductive layer 405A may be formed of a same material as the top conductive layer 405P. The array portion 401A of the redistribution structure 401, the middle insulating layer 403A, and the top conductive layer 405A together form a third decoupling unit 400A. The third decoupling unit 400A may act as temporary charge reservoirs to prevent momentary fluctuations in supply voltage. As a result, the reliability of the semiconductor device 1E may be further improved.

Figure 38:
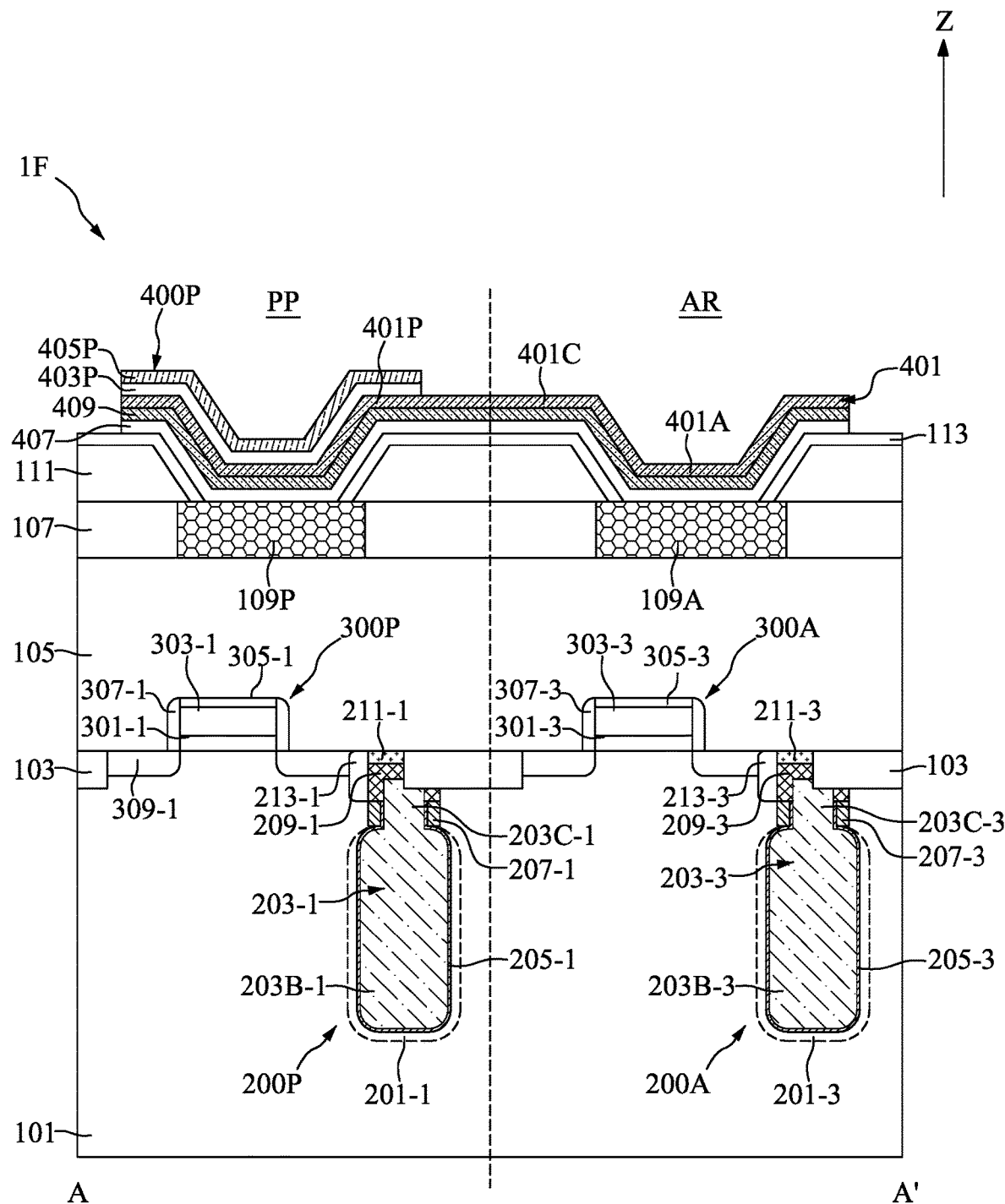

With reference to FIG. 38, the semiconductor device IF may have a structure similar to that illustrated in FIG. 33. The same or similar elements in FIG. 38 as in FIG. 33 have been marked with similar reference numbers and duplicative descriptions have been omitted.

With reference to FIG. 38, a barrier layer 407 may be formed between the pad dielectric layer 113 and the redistribution structure 401 and between the redistribution structure 401 and the pad layers 109A, 109P. In some embodiments, the barrier layer 407 may have a thickness between about 10 angstroms and about 15 angstroms. The barrier layer 407 may be formed of, for example, titanium, titanium nitride, titanium silicon nitride, tantalum, tantalum nitride, tantalum silicon nitride, or a combination thereof. The barrier layer 407 may serve as an adhesive layer between the pad layers 109A, 109P and the redistribution structure 401.

With reference to FIG. 38, an adjustment layer 409 may be formed between the barrier layer 407 and the redistribution structure 401. In some embodiments, the adjustment layer 409 may be formed of, for example, graphene, graphite, or the like. In some embodiments, the adjustment layer 409 may be formed of, for example, graphene. As the adjustment layer 409 formed of graphene has excellent electrical conductivity, the resistance between the redistribution structure 401 and the pad layers 109A, 109P can be reduced. Therefore, the power consumption for the semiconductor device IF may be decreased.

One aspect of the present disclosure provides a semiconductor device including a substrate including an array area and a peripheral area surrounding the array area, a first decoupling unit positioned in the peripheral area of the substrate, a storage unit positioned in the array area of the substrate, a redistribution structure positioned above the peripheral area and the array area of the substrate, a middle insulating layer positioned on the redistribution structure positioned above the peripheral area, and a top conductive layer positioned on the middle insulating layer. The redistribution structure positioned above the peripheral area, the middle insulating layer, and the top conductive layer together configure a second decoupling unit.

Another aspect of the present disclosure provides a method for fabricating a semiconductor device including providing a substrate including an array area and a peripheral area surrounding the array area, concurrently forming a first decoupling unit in the peripheral area of the substrate and a storage unit in the array area of the substrate, forming a redistribution structure above the peripheral area of the substrate and the array area of the substrate, forming a middle insulating layer on the redistribution structure formed above the peripheral area of the substrate, and forming a top conductive layer on the middle insulating layer. The redistribution structure formed above the peripheral area, the middle insulating layer, and the top conductive layer together configure a second decoupling unit.

Due to the design of the semiconductor device of the present disclosure, the first decoupling unit 200P and the second decoupling unit 400P may act as temporary charge reservoirs to prevent momentary fluctuations in supply voltage. As a result, the reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising an array area and a peripheral area adjacent to the array area;
a first decoupling unit positioned in the peripheral area of the substrate;
a storage unit positioned in the array area of the substrate;
a redistribution structure positioned above the peripheral area and the array area of the substrate;
a middle insulating layer positioned on the redistribution structure positioned above the peripheral area; and
a top conductive layer positioned on the middle insulating layer;
wherein the redistribution structure positioned above the peripheral area, the middle insulating layer, and the top conductive layer together configure a second decoupling unit;

wherein the redistribution structure comprises an exposed region without depositing the middle insulating layer and the top conductive layer on the redistribution structure.

2. The semiconductor device of claim 1, wherein the first decoupling unit and the storage unit are trench capacitors.

3. The semiconductor device of claim 1, wherein the first decoupling unit comprises an inner conductive layer positioned in the substrate, a buried plate surrounding a lower portion of the inner conductive layer, a capacitor dielectric layer positioned between the lower portion of the inner conductive layer and the buried plate, a strap conductive layer positioned on the inner conductive layer, a covering insulating layer positioned on the strap conductive layer, and a joint portion positioned adjacent to the strap conductive layer.

4. The semiconductor device of claim 3, wherein the inner conductive layer comprises a bottom portion surrounded by the buried plate and a collar portion positioned on the bottom portion, and the strap conductive layer is positioned on the collar portion.

5. The semiconductor device of claim 4, wherein the joint portion and the strap conductive layer have a same electrical type.

6. The semiconductor device of claim 5, further comprising a recessed collar dielectric layer surrounding a lower portion of the collar portion of the inner conductive layer.

7. The semiconductor device of claim 6, wherein the recessed collar dielectric layer is formed of silicon oxide, silicon nitride, silicon oxynitride, or silicon nitride oxide.

8. The semiconductor device of claim 7, further comprising a first switch unit positioned on the peripheral area of the substrate and positioned adjacent to the joint portion of the first decoupling unit, wherein the first switch unit and the first decoupling unit are electrically coupled.

9. The semiconductor device of claim 8, wherein a thickness of the middle insulating layer is between about 5 nm and about 100 nm.

10. The semiconductor device of claim 9, wherein the middle insulating layer is formed of silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof.

11. The semiconductor device of claim 10, further comprising a pad layer positioned under the redistribution structure and electrically connected to the redistribution structure.

12. The semiconductor device of claim 10, wherein the redistribution structure comprises a seed layer positioned above the peripheral area and the array area and a plating layer positioned on the seed layer.

13. The semiconductor device of claim 11, further comprising a barrier layer positioned between the pad layer and the redistribution structure, wherein the barrier layer is formed of titanium, titanium nitride, titanium silicon nitride, tantalum, tantalum nitride, tantalum silicon nitride, or a combination thereof.

14. The semiconductor device of claim 13, wherein a thickness of the barrier layer is between about 10 angstroms and about 15 angstroms.

15. The semiconductor device of claim 14, further comprising an adjustment layer positioned between the barrier layer and the redistribution structure, wherein the adjustment layer is formed of graphene or graphite.

16. The semiconductor device of claim 10, wherein the redistribution structure comprises a peripheral portion positioned above the peripheral area, an array portion positioned above the array area, and a connection portion connecting the peripheral portion and the array portion, and the middle insulating layer is positioned on the peripheral portion.

17. The semiconductor device of claim 16, further comprising a thermal release layer positioned on the array portion of the redistribution structure, wherein the thermal release layer is configured to sustain a thermal resistance between about $0.04°$ C. $cm^2$/Watt and about $0.25°$ C. $cm^2$/Watt.

18. The semiconductor device of claim 17, wherein the thermal release layer comprises an organic material interstitially mingled with carbon nanotubes.

19. A method for fabricating a semiconductor device, comprising:
    providing a substrate comprising an array area and a peripheral area adjacent to the array area;
    concurrently forming a first decoupling unit in the peripheral area of the substrate and a storage unit in the array area of the substrate;
    forming a redistribution structure above the peripheral area of the substrate and the array area of the substrate;
    forming a middle insulating layer on the redistribution structure formed above the peripheral area of the substrate; and
    forming a top conductive layer on the middle insulating layer;
    wherein the redistribution structure formed above the peripheral area, the middle insulating layer, and the top conductive layer together configure a second decoupling unit;
    wherein the redistribution structure comprises an exposed region without depositing the middle insulating layer and the top conductive layer on the redistribution structure.

20. The method for fabricating the semiconductor device of claim 19, wherein the first decoupling unit and the storage unit are trench capacitors.

* * * * *